(12) United States Patent
Shinokawa et al.

(10) Patent No.: US 10,020,323 B2
(45) Date of Patent: Jul. 10, 2018

(54) THIN-FILM TRANSISTOR DEVICE AND DISPLAY DEVICE USING SAME

(71) Applicant: JOLED INC., Tokyo (JP)

(72) Inventors: Yasuharu Shinokawa, Tokyo (JP); Kenichi Nendai, Tokyo (JP); Takashi Osako, Tokyo (JP)

(73) Assignee: JOLED INC., Tokyo (JP)

( * ) Notice: Subject to any disclaimer, the term of this patent is extended or adjusted under 35 U.S.C. 154(b) by 12 days.

(21) Appl. No.: 15/308,353

(22) PCT Filed: Apr. 23, 2015

(86) PCT No.: PCT/JP2015/002203
§ 371 (c)(1),
(2) Date: Nov. 1, 2016

(87) PCT Pub. No.: WO2015/166651
PCT Pub. Date: Nov. 5, 2015

(65) Prior Publication Data
US 2017/0084632 A1    Mar. 23, 2017

(30) Foreign Application Priority Data
May 2, 2014    (JP) ................................. 2014-095338

(51) Int. Cl.
*H01L 27/12* (2006.01)
*H01L 29/786* (2006.01)
(Continued)

(52) U.S. Cl.
CPC .............. *H01L 27/124* (2013.01); *G09F 9/30* (2013.01); *H01L 21/768* (2013.01);
(Continued)

(58) Field of Classification Search
None
See application file for complete search history.

(56) References Cited

U.S. PATENT DOCUMENTS 5,443,922 A    8/1995  Nishizaki et al.
6,124,622 A *  9/2000  Tsutsumi .......... H01L 21/28123
                                              257/288
(Continued)

FOREIGN PATENT DOCUMENTS

JP    5-163488 A     6/1993
JP    11-242238 A    9/1999
(Continued)

OTHER PUBLICATIONS

International Search Report in International Patent Application No. PCT/JP2015/002203, dated Jul. 28, 2015.

*Primary Examiner* — Kimberly Rizkallah
*Assistant Examiner* — Bo Bin Jang
(74) *Attorney, Agent, or Firm* — Hauptman Ham, LLP

(57) ABSTRACT

A display device including: a lead wiring layer pattern 207, made from metal, that extends outside a region 10A on a substrate in which a light-emitter is present; a passivation layer 216; a contact hole 216a in the passivation layer 216 outside the region 10A in a position over the lead wiring layer pattern 207 in plan view; a connecting wiring layer pattern 237 that is continuous across the passivation layer 216, an inner circumference of the contact hole 216a, and the lead wiring layer pattern 207 in the contact hole 216a; a sealing layer 217 covering a portion of the connecting wiring layer pattern 237 in the contact hole 216a; and an upper sealing layer pattern 219 covering the sealing layer pattern 217 that is above the connecting wiring layer pattern 237.

19 Claims, 13 Drawing Sheets

(51) Int. Cl.
*G09F 9/30* (2006.01)
*H01L 23/522* (2006.01)
*H01L 21/768* (2006.01)
*H01L 51/50* (2006.01)
*H05B 33/06* (2006.01)
*H05B 33/22* (2006.01)
*H05B 33/26* (2006.01)
*H01L 27/32* (2006.01)

(52) U.S. Cl.
CPC ........ *H01L 23/522* (2013.01); *H01L 27/1248* (2013.01); *H01L 27/1259* (2013.01); *H01L 29/786* (2013.01); *H01L 29/78606* (2013.01); *H01L 51/50* (2013.01); *H05B 33/06* (2013.01); *H05B 33/22* (2013.01); *H05B 33/26* (2013.01); *H01L 27/3258* (2013.01); *H01L 27/3276* (2013.01); *H01L 2924/0002* (2013.01)

(56) References Cited

U.S. PATENT DOCUMENTS

| | | |
|---|---|---|
| 6,169,593 B1 | 1/2001 | Kanaya et al. |
| 2002/0131003 A1* | 9/2002 | Matsumoto ........... G02F 1/1345 349/139 |
| 2006/0139502 A1 | 6/2006 | Ahn et al. |
| 2008/0137021 A1 | 6/2008 | Choi et al. |
| 2008/0224133 A1* | 9/2008 | Park .................. H01L 21/02554 257/43 |
| 2009/0002623 A1 | 1/2009 | Oda et al. |
| 2010/0193783 A1 | 8/2010 | Yamazaki et al. |
| 2010/0194723 A1 | 8/2010 | Moriwaki |

FOREIGN PATENT DOCUMENTS

| | | |
|---|---|---|
| JP | 2002-236459 A | 8/2002 |
| JP | 2004-247533 A | 9/2004 |
| JP | 2008-41277 A | 2/2008 |
| JP | 2008-268830 A | 11/2008 |
| JP | 2010-199566 A | 9/2010 |
| WO | 2009/016858 A1 | 2/2009 |

\* cited by examiner

THIN-FILM TRANSISTOR DEVICE AND DISPLAY DEVICE USING SAME

RELATED APPLICATIONS

The present application is a National Phase of International Application Number PCT/JP2015/002203, filed on Apr. 23, 2015, which claims priority to Japanese Patent Application Number 2014-095338, filed on May 2, 2014.

TECHNICAL FIELD

The present invention relates to thin-film transistor devices and display devices using same.

BACKGROUND ART

In recent years, as display panels used in display devices such as digital televisions, display panels have been implemented in which a plurality of pixels made from light-emitting elements such as organic light-emitting elements are arranged in column and row directions on a substrate. A typical, publicly-known configuration of such a display panel is one in which drive circuits each made from a plurality of thin film transistors (TFT) are each disposed in a line-shape, an insulating layer is disposed on the drive circuits, and, for each drive circuit, a plurality of light-emitting elements is connected thereto, disposed on the insulating layer in a line. In such a display panel, typically, source and gate lines extending in the column or row directions from the thin-film transistors disposed on the substrate are connected to output power of drivers via external connection terminals disposed on a periphery of the substrate (for example, see Patent Literature 1).

FIG. 15 shows an example cross-section taken along a direction of a source line of a substrate used in a conventional display device. As shown in FIG. 15, a metal wiring layer pattern 1207 is disposed on an upper surface of a substrate 1100, an insulating layer 1216 is disposed on the metal wiring layer pattern 1207, and a connecting wiring layer pattern 1237 made from, for example, indium tin oxide (ITO) is disposed on an upper surface of the insulating layer 1216. The metal wiring layer pattern 1207 and the connecting wiring layer pattern 1237 are electrically connected to each other via a contact hole 1216a provided in the insulating layer 1216. The metal wiring layer pattern 1207 is connected to a source electrode 117 of a thin-film transistor disposed to the right of the drawing. The source electrode 1107 is electrically connected to an output terminal (not illustrated) of a source driver via a connecting terminal 1237a of the connecting wiring layer pattern 1237 disposed to the left of the drawing.

CITATION LIST

Patent Literature

[Patent Literature 1] JP 2004-247533

SUMMARY OF INVENTION

Technical Problem

However, according to the configuration described above, after forming a thin-film transistor on a substrate, when patterning, for example, pixel electrodes of light-emitting elements by etching, there is a risk of etchant penetrating downwards through the connecting wiring layer pattern in the contact hole to corrode the metal wiring layer pattern on the upper surface of the substrate. In such a case, between the connecting wiring layer pattern and the metal wiring layer pattern, an increase in electrical resistance can occur, bad connections can occur, and a decrease in operation stability of the display device can occur.

The present invention has been achieved in view of the above technical problem, and an aim thereof is to provide a thin-film transistor device that prevents corrosion of a connecting portion of the metal wiring layer pattern, on the substrate, that connects to the connecting wiring layer pattern, thereby increasing operation stability of a display device, and to provide a display device that uses same.

Solution to Problem

The display device pertaining to one aspect of the present invention comprises: a substrate; a light-emitter disposed on the substrate; a transistor that drives the light-emitter; a lead wiring layer pattern, made from metal, that extends from a source, drain, or gate of the transistor to an outer region outside a region in which the light-emitter is present; a passivation layer in which a contact hole is opened, the passivation layer being disposed covering the lead wiring layer pattern, the contact hole, in plan view, being superimposed over the lead wiring layer pattern in the outer region; a connecting wiring layer pattern that is continuous across the passivation layer, an inner circumference of the contact hole, and the lead wiring layer pattern in the contact hole; a sealing layer pattern disposed on the connecting wiring layer pattern, covering a portion of the connecting wiring layer pattern in the contact hole; and an upper sealing layer pattern disposed above the connecting wiring layer pattern, covering the sealing layer pattern.

Advantageous Effects of Invention

According to the thin-film transistor device pertaining to one aspect of the present invention, and the display device using same, corrosion is prevented of the lead wiring layer pattern at a connecting portion between the lead wiring layer pattern, which is made from metal and disposed on the substrate, and the connecting wiring layer pattern, increasing drive stability of the display device.

DESCRIPTION OF EMBODIMENTS

Summary of Embodiments

Figure 1:
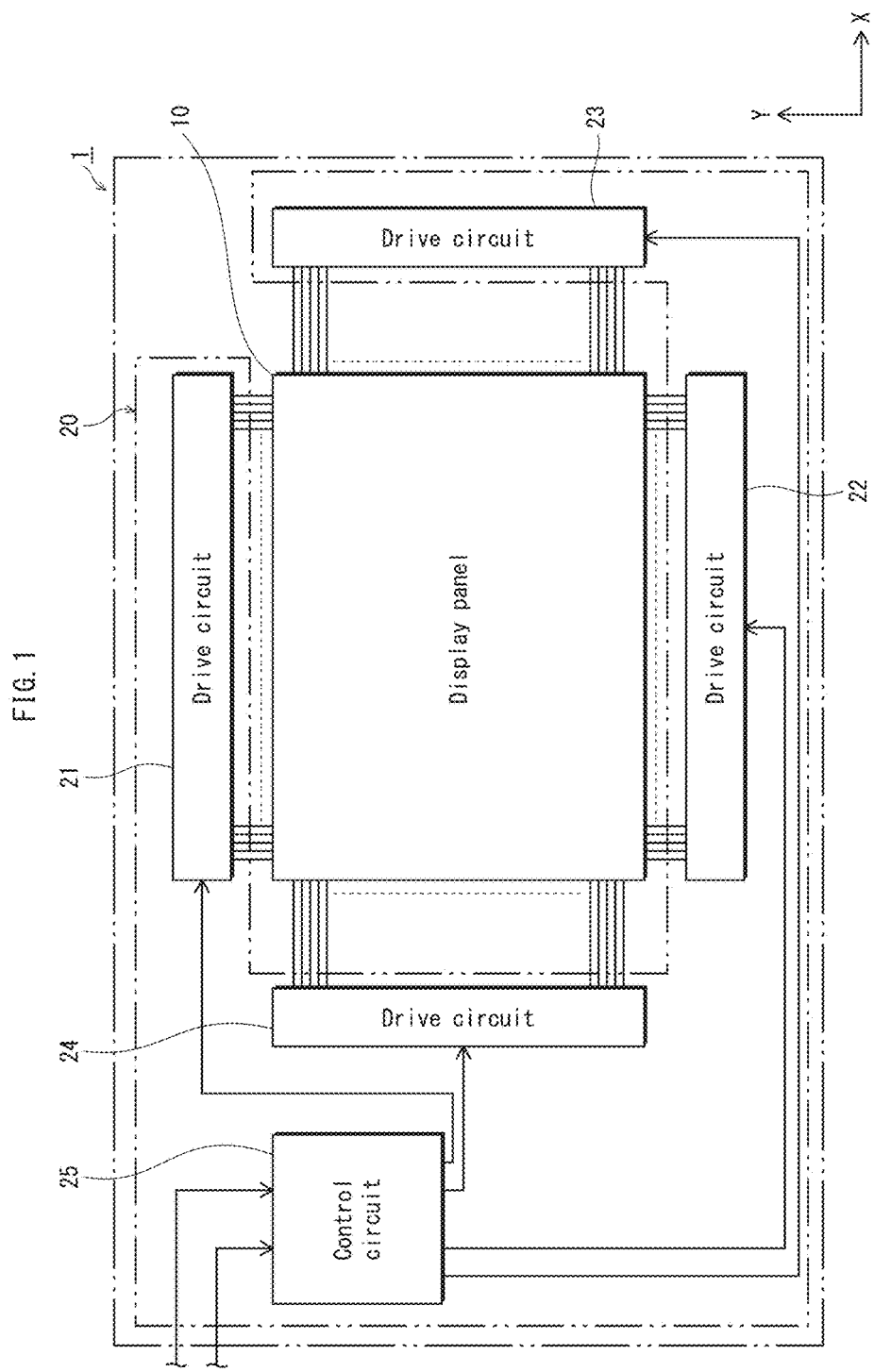
FIG. 1 is a schematic block diagram showing a configuration of a display device 1 pertaining to Embodiment 1.

The display device pertaining to one aspect of the present invention comprises: a substrate; a light-emitter disposed on the substrate; a transistor that drives the light-emitter; a lead wiring layer pattern, made from metal, that extends from a source, drain, or gate of the transistor to an outer region outside a region in which the light-emitter is present; a passivation layer in which a contact hole is opened, the passivation layer being disposed covering the lead wiring layer pattern, the contact hole, in plan view, being superimposed over the lead wiring layer pattern in the outer region; a connecting wiring layer pattern that is continuous across the passivation layer, an inner circumference of the contact hole, and the lead wiring layer pattern in the contact hole; a sealing layer pattern disposed on the connecting wiring layer pattern, covering a portion of the connecting wiring layer pattern in the contact hole; and an upper sealing layer pattern disposed above the connecting wiring layer pattern, covering the sealing layer pattern.

Another configuration further comprises: a connecting terminal portion for connecting a portion of the connecting wiring layer pattern on the passivation layer to wiring outside the region.

According to another configuration, the sealing layer pattern and the upper sealing layer pattern are electrically conductive, and the upper sealing layer pattern, above the passivation layer, extends along the connecting wiring layer pattern to the connecting terminal portion or near the connecting terminal portion.

According to another configuration, the connecting wiring layer pattern extends to a periphery or near the periphery of the substrate, and the connecting terminal portion is disposed where the connecting wiring layer pattern terminates at the periphery or near the periphery of the substrate.

According to another configuration, the sealing layer pattern fills the contact hole and an upper portion of the sealing layer pattern slightly protrudes from the contact hole.

According to another configuration, in the passivation layer, in plan view, a plurality of the contact hole is superimposed over the lead wiring layer pattern, and a plurality of the sealing layer pattern is disposed therein, the sealing layer patterns being separate from each other.

According to another configuration, in the passivation layer, in plan view, a plurality of the contact hole is superimposed over the lead wiring layer pattern, and the sealing layer pattern is continuous across the plurality of contact holes.

According to another configuration, the lead wiring layer pattern is a layered metal body of layers including a layer including copper or the lead wiring layer pattern is an alloy layer including copper.

According to another configuration, the sealing layer pattern is a layered metal body of layers including a layer including copper or the sealing layer pattern is an alloy layer including copper.

According to another configuration, the upper sealing layer pattern is a layered metal body consisting of a thin film made from tungsten and a thin film made from aluminium or aluminium alloy. The thin-film transistor device pertaining to one aspect of the present invention comprises: a substrate; a light-emitter disposed on the substrate; a transistor that drives the light-emitter; a lead wiring layer pattern, made from metal, that extends from a source, drain, or gate of the transistor to an outer region outside a region in which the light-emitter is present; a passivation layer in which a contact hole is opened, the passivation layer being disposed covering the lead wiring layer pattern, the contact hole, in plan view, being superimposed over the lead wiring layer pattern in the outer region; a connecting wiring layer pattern that is continuous across the passivation layer, an inner circumference of the contact hole, and the lead wiring layer pattern in the contact hole; a sealing layer pattern disposed on the connecting wiring layer pattern, covering a portion of the connecting wiring layer pattern in the contact hole; and an upper sealing layer pattern disposed above the connecting wiring layer pattern, covering the sealing layer pattern.

Another configuration further comprises: a connecting terminal portion for connecting a portion of the connecting wiring layer pattern on the passivation layer to wiring outside the region.

According to another configuration, the sealing layer pattern and the upper sealing layer pattern are electrically conductive, and the upper sealing layer pattern, above the passivation layer, extends along the connecting wiring layer pattern to the connecting terminal portion or near the connecting terminal portion.

According to another configuration, the connecting wiring layer pattern extends to a periphery or near the periphery of the substrate, and the connecting terminal portion is disposed where the connecting wiring layer pattern terminates at the periphery or near the periphery of the substrate.

According to another configuration, the sealing layer pattern fills the contact hole and an upper portion of the sealing layer pattern protrudes from the contact hole.

According to another configuration, in the passivation layer, in plan view, a plurality of the contact hole is superimposed over the lead wiring layer pattern, and a plurality of the sealing layer pattern is disposed therein, the sealing layer patterns being separate from each other.

According to another configuration, in the passivation layer, in plan view, a plurality of the contact hole is superimposed over the lead wiring layer pattern, and the sealing layer pattern is continuous across the plurality of contact holes.

According to another configuration, the lead wiring layer pattern is a layered metal body of layers including a layer including copper or the lead wiring layer pattern is an alloy layer including copper.

According to another configuration, the sealing layer pattern is a layered metal body of layers including a layer including copper or the sealing layer pattern is an alloy layer including copper.

According to another configuration, the upper sealing layer pattern is a layered metal body consisting of a thin film made from tungsten and a thin film made from aluminium or aluminium alloy.

Embodiment 1

1. Overall Configuration of Display Device 1

The following describes an overall configuration of a display device 1 pertaining to Embodiment 1, with reference to FIG. 1.

As shown in FIG. 1, the display device 1 pertaining to the present embodiment is configured to have a display panel 10 and a drive/control circuit 20 connected thereto.

The display panel 10 is an organic electroluminescence (EL) panel using electroluminescence of organic material, in which a plurality of organic EL elements are disposed, for example, in a matrix of rows and columns. The drive/control circuit 20 includes four drive circuits 21, 22, 23, 24 and a control circuit 25.

The arrangement of circuits of the drive/control circuit 20 in relation to the display panel 10 in the display device 1 is not limited to the example shown in FIG. 1.

2. Circuit Configuration of Display Panel 10

A circuit configuration of each pixel 10a in the display panel 10 is described with reference to FIG. 2.

Figure 2:
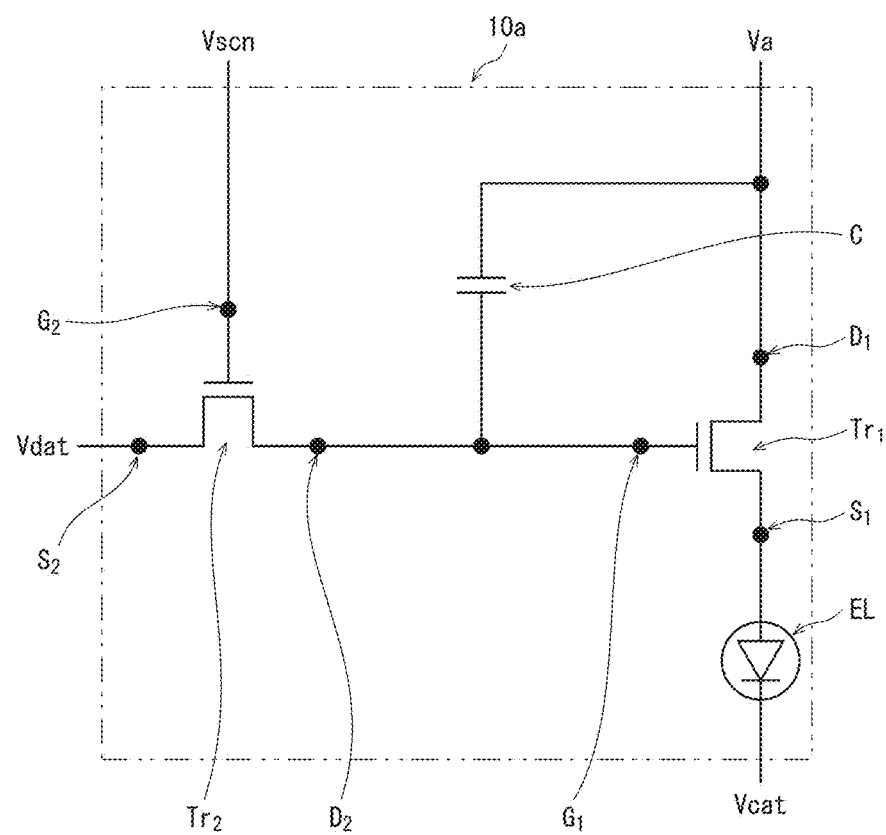
FIG. 2 is a schematic circuit diagram showing circuit configuration of each pixel 10a in a display panel 10 used in the display device 1.

As shown in FIG. 2, in the display panel 10 pertaining to the present embodiment, each of the pixels 10a is configured to have two transistors $Tr_1$, $Tr_2$, one capacitor C, and an EL element EL as a light-emitter. Of the two transistors $Tr_1$, $Tr_2$, one is a drive transistor $Tr_1$ and the other is a switching transistor $Tr_2$.

A gate $G_2$ of the switching transistor $Tr_2$ is connected to a scanning line Vscn and a source S2 of the switching transistor $Tr_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power supply line Va and a source $S_1$ of the drive transistor $Tr_1$ is connected to an anode of the EL element EL. A cathode of the EL element EL is connected to a ground line Vcat.

The capacitor C connects the drain $D_2$ of the switching transistor $Tr_2$, the gate $G_1$ of the drive transistor $Tr_1$, and the power supply line Va.

Figure 3:
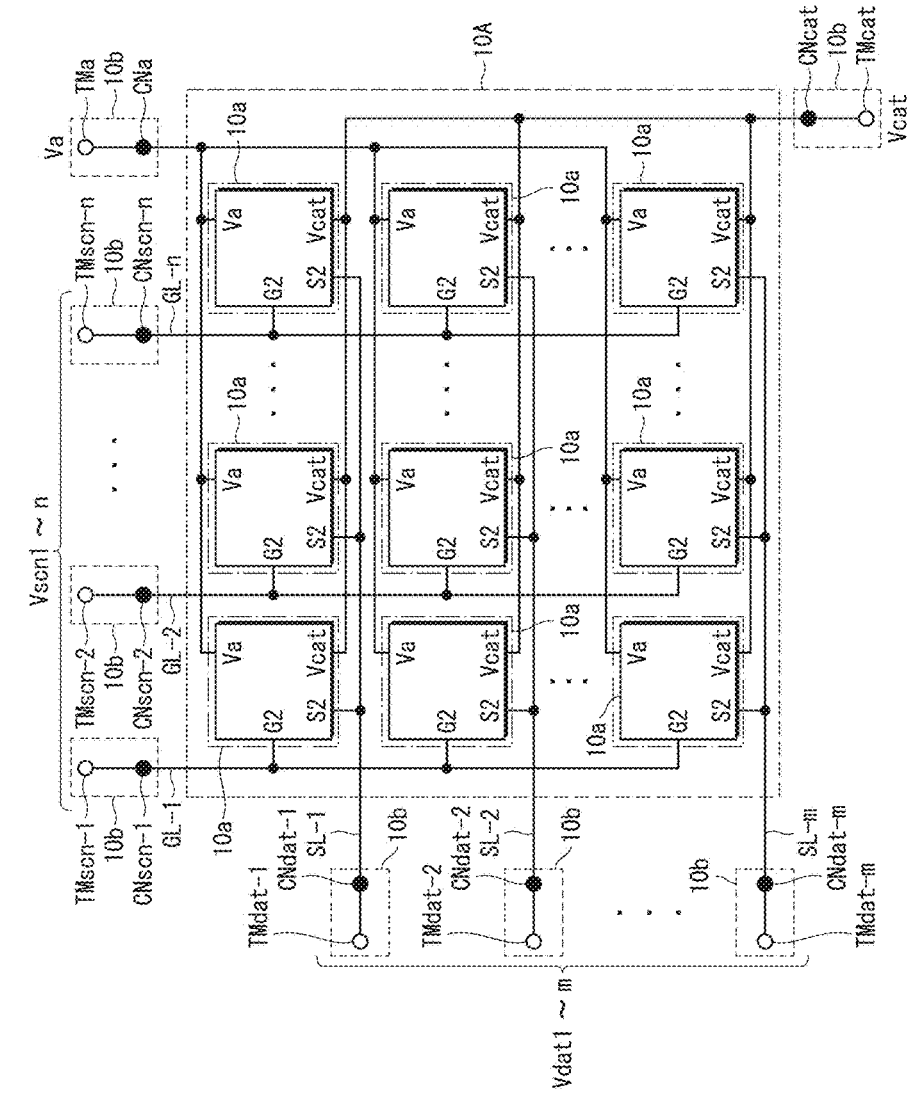
FIG. 3 is a schematic circuit diagram showing circuit configuration of the display panel 10.

FIG. 3 is an example of a circuit schematic showing circuit configuration of the display panel 10. In the display panel 10, pixels 10a that have a circuit configuration as shown in FIG. 2 constitute a pixel region 10A in which the pixels 10a are arranged in a matrix.

As shown in FIG. 3, gate lines GL extend from gates $G_2$ of pixels arranged in the matrix, and are connected to scanning lines Vscn that are connected from outside the display panel 10 (not illustrated as they are outside the display panel 10). More specifically, each of the gate lines GL-1 to GL-n are, in a connection region 10b outside the pixel region 10A, connected to external connecting terminals TMscn-1 to TMscn-n via wiring connecting portions CNscn-1 to CNscn-n, and are connected to scanning lines Vscn-1 to Vscn-n.

Similarly, source lines SL-1 to SL-m extend from sources $S_2$ of each pixel and are, in the connection region 10b, connected to external connecting terminals TMdat-1 to TMdat-m via wiring connecting portions CNdat-1 to CNdat-m, and are connected to data lines Vdat-1 to Vdat-m that are connected from outside the display panel 10 (not illustrated as they are outside the display panel 10).

Further, power supply lines Va of each pixel are aggregated and, in connection region 10b, connect to external connecting terminal TMa via wiring connecting portion CNa. Ground lines Vcat of each pixel are aggregated into a common lead wiring layer pattern, and, in a connection region 10b, connected to an external connecting terminal TMcat via a wiring connecting portion CNcat.

In a display device that performs color display, adjacent ones of the pixels 10a (for example, three of the pixels 10a emit the colors red (R), green (G), and blue (B), respectively) are sub-pixels, and a combination of adjacent ones of the pixels 10a constitute one pixel.

3. Configuration of Display Panel 10

A configuration of the display panel 10 is described with reference to the schematic cross-section of FIG. 4.

The display panel 10 pertaining to the present embodiment is a top-emission type of an organic EL display panel, in which a TFT device is disposed lower in a Z-axis direction, above which an EL element is disposed.

(1) TFT Device

Figure 4:
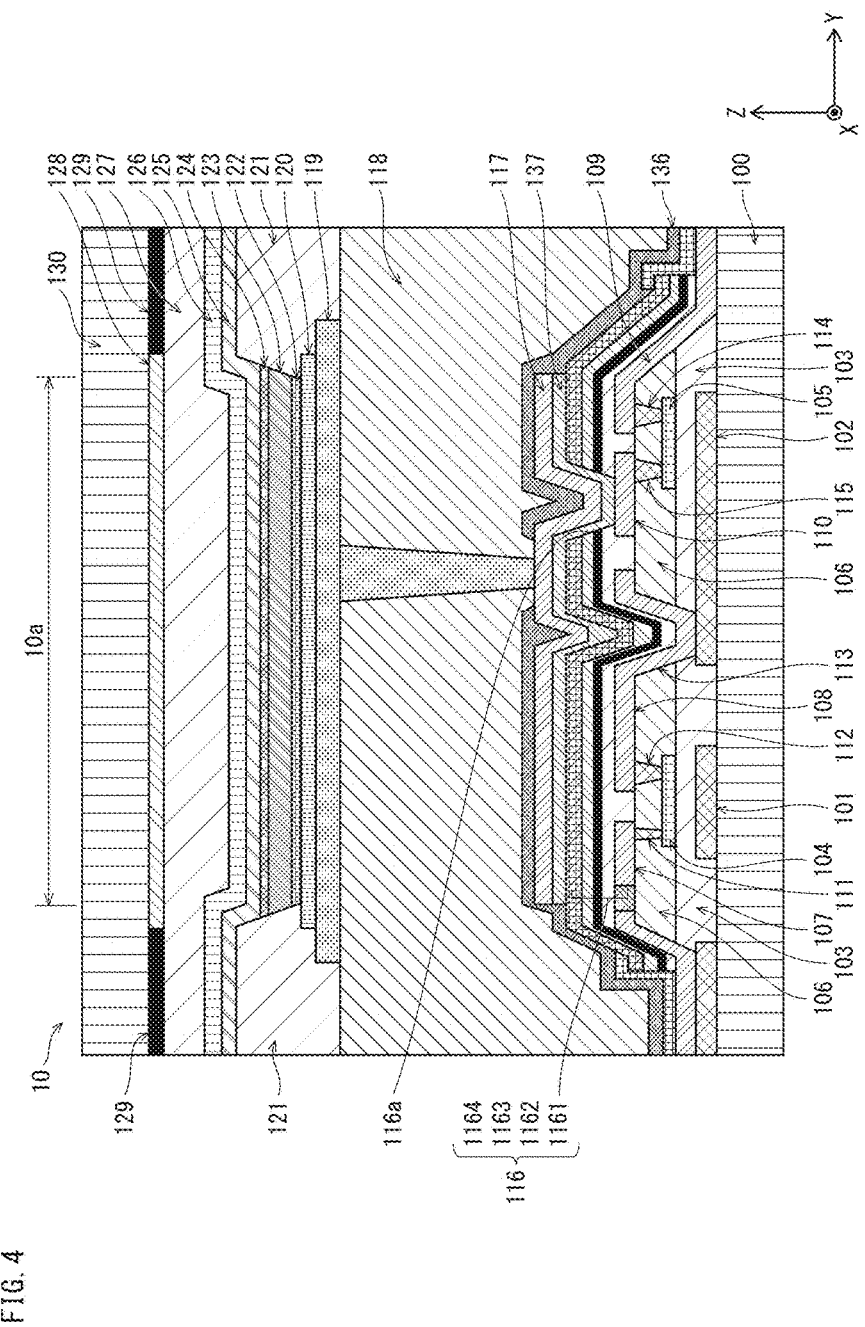
FIG. 4 is a schematic cross-section showing configuration of each pixel 10a in the display panel 10.

As shown in FIG. 4, gate electrodes 101, 102 are disposed on a substrate 100 with a gap therebetween, and a gate insulating layer 103 is disposed covering the gate electrodes 101, 102 and a surface of the substrate 100. Channel layers 104, 105 are disposed on the gate insulating layer 103, corresponding with the gate electrodes 101, 102, respectively. A channel protection layer 106 is disposed covering the channel layers 104, 105 and a surface of the gate insulating layer 103.

A source electrode 107 and a drain electrode 108 are disposed on the channel protection layer 106 with a gap therebetween, corresponding to the gate electrode 101 and the channel layer 104. Similarly, a source electrode 110 and a drain electrode 109 are disposed on the channel protection layer 106 with a gap therebetween, corresponding to the gate electrode 102 and the channel layer 105.

At a lower portion of the source electrodes 107, 110 and the drain electrodes 108, 109 are disposed source lower electrodes 111, 115 and drain lower electrodes 112, 114, which penetrate through the channel protection layer 106. In the Z-axis direction, lower portions of the source lower electrode 111 and the drain lower electrode 112 are in contact with the channel layer 104, and lower portions of the drain lower electrode 114 and the source lower electrode 115 are in contact with the channel layer 105.

Further, the drain electrode 108 and the gate electrode 102 are connected to each other by a contact plug 113 through the gate insulating layer 103 and the channel protection layer 106.

The gate electrode 101 corresponds to the gate $G_2$ of FIG. 2, the source electrode 107 corresponds to the source $S_2$ of FIG. 2, and the drain electrode 108 corresponds to the drain $D_2$ of FIG. 2. Similarly, the gate electrode 102 corresponds to the gate $G_1$ of FIG. 2, the source electrode 110 corresponds to the source $S_1$ of FIG. 2, and the drain electrode 109 corresponds to the drain $D_1$ of FIG. 2. Accordingly, in FIG. 3 the switching transistor $Tr_2$ is disposed to the left in the Y-axis direction and the drive transistor Tr$_1$ is disposed to the right in the Y-axis direction. However, disposition of the transistors Tr$_1$, Tr$_2$ is not limited to this example.

A passivation layer 116 is disposed covering the source electrodes 107, 110, the drain electrodes 108, 109, and the channel protection layer 106. A contact hole 116a is opened in the passivation layer 116 above a portion of the source electrode 110, and a lower connecting electrode layer 137 and an upper connecting electrode layer 117 are layered in this order following side walls of the contact hole 116a.

In the Z-axis direction, a lower portion of the lower connecting electrode layer 137 is connected to the source electrode 110 and a portion of an upper portion rises above the passivation layer 116. An upper passivation layer 136 is disposed covering the upper connecting electrode layer 117 and the passivation layer 116. An interlayer insulating layer 118 is disposed on the upper passivation layer 136.

(2) Light-Emitting Element

For each of the pixels 10a, an anode 119 is disposed on the interlayer insulating layer 118. The anode 119 is connected to the upper connecting electrode layer 117 through a contact hole opened in the interlayer insulating layer 118 above the upper connecting electrode layer 117.

A hole injection layer 120 is disposed on the anode 119 and banks 121 are disposed covering edges of the hole injection layer 120. The banks 121 surround each of the pixels 10a, defining openings corresponding to the pixels 10a.

In an opening defined by the banks 121, in order from a lower end in the Z-axis direction upwards, a hole transport layer 122, a light-emitting layer 123, and an electron transport layer 124 are disposed. The hole transport layer 122, at a lower portion thereof in the Z-axis direction, is in contact with the hole injection layer 120.

A cathode 125 and a sealing layer 126 are layered in this order to cover the electron transport layer 124 and the banks 121. The cathode 125 is continuous across the display panel 10, and is connected per pixel or per plurality of pixels to bus bar wiring (not illustrated).

A color filter layer 128 and a light-shielding layer 129 are disposed on a lower surface of a substrate 130, and disposed above the sealing layer 126 in the Z-axis direction, being attached to the sealing layer 126 by a joining layer 127.

(3) Configuration of Connection Region 10b

Figure 5:
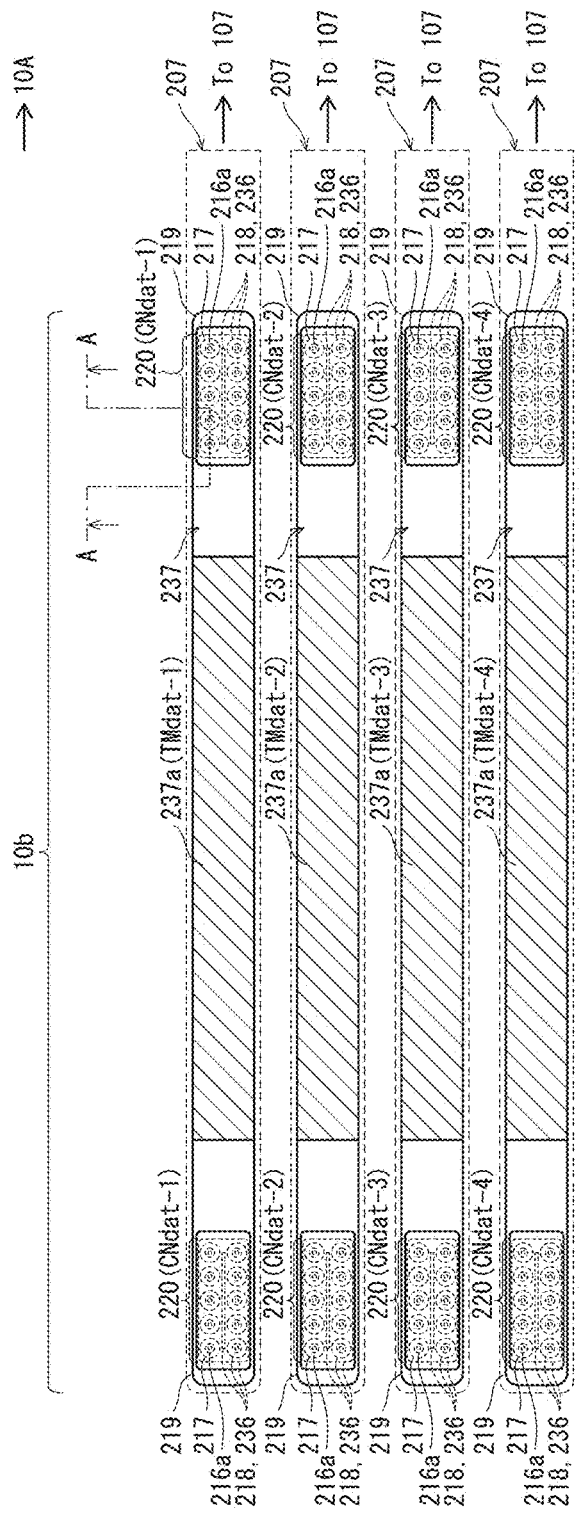
FIG. 5 is a plan view enlargement of wiring connecting portions 220 (CNdat) and connecting terminal portions 237a (TMdat) in a connection region 10b of the display panel 10.
Figure 6:
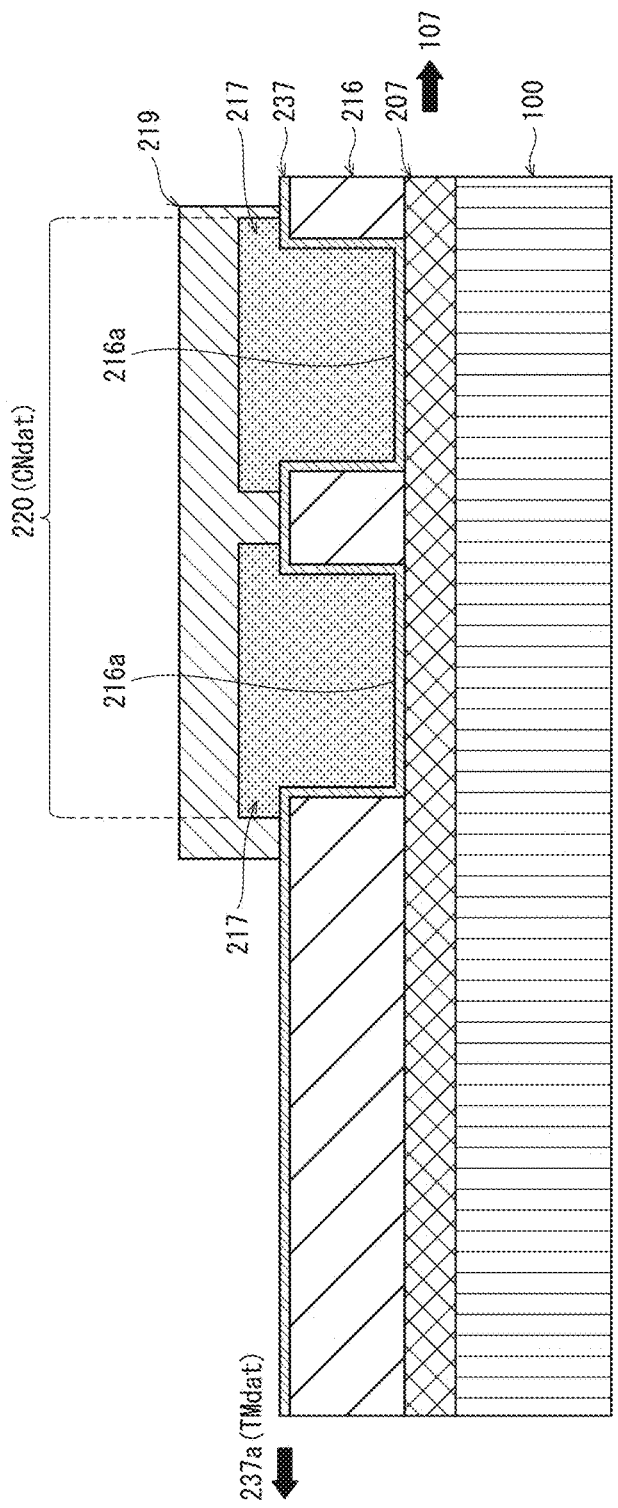
FIG. 6 is a cross-section enlargement taken along a wiring direction of a wiring connecting portion 220 (CNdat) of the display panel 10.

As described above, in the display panel 10, the source lines SL extend from the gate sources S$_2$ of pixels, and in the connection region 10b, which is outside the pixel region 10A, are connected to the external connecting terminals TMdat-1 to TMdat-m via the wiring connecting portions CNdat-1 to CNdat-m. FIG. 5 is a plan view enlargement of the wiring connecting portions 220 (CNdat) and the connecting terminal portions 237a (TMdat) in the connection region 10b of the display panel 10. In this example, wiring connecting portions CNdat-1 to CNdat-4 and connecting terminal portions TMdat-1 to TMdat-4 are shown. FIG. 6 is a cross-section enlargement taken along a wiring direction of the wiring connecting portion 220 (CNdat) of the display panel 10, showing a cross-section along A-A in FIG. 5.

(Lead Wiring Layer Patterns 207, Passivation Layer 216, Connecting Wiring Layer Patterns 237)

As shown in FIG. 5 and FIG. 6, the lead wiring layer patterns 207 include a plurality of source lines SL extending from the source electrode 107 of pixels electrically connected at the wiring connecting portions 220 (CNdat) to a plurality of connecting wiring layer patterns 237 on the passivation layer 216, within contact holes 216a. In the connection region 10b, the wiring connecting portions 220 (CNdat) are provided at two locations along a longitudinal direction of the lead wiring layer patterns 207, arranged in regions either side of each of the connecting terminal portions 237a (TMdat). By providing a plurality of the wiring connecting portions 220 (CNdat), redundancy in connection is provided. Even if one is damaged, connectivity is not lost. The connecting wiring layer patterns 237 extend to a periphery or near the periphery of the substrate 100, and are connected to data lines Vdat at the connecting terminal portions 237a (TMdat) formed at terminals thereof. In the present embodiment, the lead wiring layer patterns 207 are parallel with each other, and ten of the contact holes 216a are provided at each of the wiring connecting portions 220. Further, the lead wiring layer patterns 207 and the connecting wiring layer patterns 237 are parallel. However, shape of electrode layer patterns and number of the contact holes 216a are not limited to this example, and may be decided as appropriate. Further, the connecting terminal portions 237a (TMdat) may be formed at end portions of the connecting wiring layer patterns 237.

As shown in FIG. 6, the lead wiring layer patterns 207 are on an upper surface of the substrate 100, the passivation layer 216 is on the lead wiring layer patterns 207, and the connecting wiring layer patterns 237 are on the passivation layer 216. The connecting wiring layer patterns 237 are configured from the same material as the lower connecting electrode layer 137, which is in the pixel region 10A. The connecting wiring layer patterns 237, as described above, extend to a periphery or near the periphery of the substrate 100, and the connecting terminal portions 237a (TMdat) at ends thereof are connected to data lines Vdat.

The contact holes 216a, in plan view, as shown in FIG. 5, are provided in a region in which the lead wiring layer patterns 207 and the connecting wiring layer patterns 237 overlap on the passivation layer 216, forming the wiring connecting portions 220. The connecting wiring layer patterns 237, in a cross-section, are disposed continuously on an upper surface of the passivation layer 216, on an inner circumferential surface of each of the contact holes 216a, and on an upper surface of the lead wiring layer patterns 207 in the contact holes 216a, as shown in FIG. 6. The lead wiring layer patterns 207 and the connecting wiring layer patterns 237 are electrically connected to each other in the contact holes 216a. FIG. 6 shows a cross-section taken along A-A in FIG. 5, but among the wiring connecting portions 220 (CNdat), the area around each of the contact holes 216a not shown in FIG. 6 has the same cross-section as shown in FIG. 6.

(Sealing Layer Patterns 217)

For each of the contact holes 216a, a portion of the connecting wiring layer patterns 237 in the contact hole 216a is covered by a portion of the sealing layer patterns 217. The sealing layer patterns 217 are made from the same electrically conductive material as the upper connecting electrode layer 117. According to the sealing layer patterns 217, portions of the connecting wiring layer patterns 237 in the contact holes 216a are sealed. It is preferable that the sealing layer patterns 217 completely fill the contact holes 216a and upper portions thereof protrude slightly from the contact holes 216a. This is to ensure sealing. Further, each of the sealing layer patterns 217 in the contact holes 216a is separate from other ones of the sealing layer patterns 217. Thus, the sealing layer patterns 217 can be made from the minimum material required for sealing. However, the sealing layer patterns 217 may be continuous across a plurality of the contact holes 216a. In such a case, patterning of the sealing layer patterns 217 is easier during manufacture.

(Upper Sealing Layer Patterns 219)

Upper sealing layer patterns 219 are disposed covering the sealing layer patterns 217 above the connecting wiring layer patterns 237. According to the upper sealing layer patterns 219, portions of the sealing layer patterns 217 and the connecting wiring layer patterns 237 in the contact holes 216a are sealed. The upper sealing layer patterns 219 are made from the same electrically conductive material as the anode 119. Thus, after forming the sealing layer patterns 217, when etching, developing, baking, etc., is performed in forming the light-emitters EL, for example, the sealing layer patterns 217 are sealed by the upper sealing layer patterns 219, preventing the sealing layer patterns 217 from being damaged by etchant or heat.

(Other Items)

Electrode layer patterns extended from gate lines GL that are extended from the gate electrodes 101 of pixels can also take the same configuration as described above. Electrode layer patterns extended from gate lines GL are electrically connected at the wiring connecting portions 220 (CNscn) to the connecting wiring layer patterns 237 on the passivation layer 216 and in the contact holes 216a, and the connecting wiring layer patterns 237 are connected to scanning lines Vscn at the connecting terminal portions 237a (TMscn) at the periphery of or extended near to the periphery of the substrate 100. The same configuration is applied to electrode layer patterns extended from power supply lines Va and ground lines Vcat.

(4) Materials

One example is described below of materials of elements shown in FIG. 3.

(i) Substrate 100, 130

For the substrate 100, 130, for example, a glass substrate, a silica glass substrate, a metal substrate such as molybdenum sulfide, copper, zinc, aluminium, stainless steel, magnesium, iron, nickel, gold, or silver, a semiconductor substrate based on gallium arsenide, or a plastic substrate can be used.

As a plastic material, any thermoplastic or thermosetting resin may be used. For example, polyolefin such as polyethylene, polypropylene, ethylene-propylene copolymer, ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, styrene acrylonitrile copolymer (SAN), butadiene styrene copolymer, ethylene vinyl alcohol (EVOH), polyethylene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, other fluorine-based resins, various thermoplastic elastomers such as styrene-, polyolefin-, polyvinylidene chloride-, polyurethane-, fluorine rubber-, or chlorinated polyethylene-based thermoplastic elastomers, epoxy resin, phenol resin, urea resin, melamine resin, unsaturated polyester, silicone resin, polyurethane, or a copolymer, blend, polymer alloy, etc., primarily consisting of one of the above, or a layered body including layers of one or more of the above can be used.

(ii) Gate Electrodes 101, 102

For the gate electrodes 101, 102, a layered body of copper (Cu) and molybdenum (Mo) is used (Cu: approx. 200 nm, Mo: approx. 20 nm). However, configuration of the gate electrodes 101, 102 is not limited to this example, another example is that Cu, Cu/W can be used, and the following materials can be used.

Aside from the above examples, the following materials can be used: a metal such as chromium (Cr), aluminium (Al), tantalum (Ta), niobium (Nb), silver (Ag), gold (Au), platinum (Pt), palladium (Pd), indium (In), nickel (Ni), or neodymium (Nd), or an alloy thereof, a conductive metal oxide such as zinc oxide, tin oxide, indium oxide, or gallium oxide, a conductive metal composite oxide such as indium tin oxide (ITO), indium zinc oxide (IZO), aluminium zinc oxide (AZO), or gallium zinc oxide (GZO), a conductive polymer such as polyaniline, polypyrrole, polythiophene, or polyacetylene, or any of the above with an added dopant such as an acid such as hydrochloric, sulfuric, or sulfonic acid, a Lewis acid such as hexafluoride phosphorus, arsenic pentafluoride, or iron chloride, a halogen atom such as iodine, or a metal atom such as sodium or potassium, or a conductive composite material in which carbon black or metal particles are dispersed. Further, a polymer mixture may be used that includes conductive particles such as fine metal particles and graphite. One, two, or more of the above can be combined.

(iii) Gate Insulating Layer 103

For the gate insulating layer 103, a layered body of silicon oxide ($SiO_2$) and silicon nitride (SiNx) is used (SiO: approx. 80 nm, SiN: approx. 70 nm). However, configuration of the gate insulating layer 103 is not limited to this example, and, for example, any publicly known organic material or inorganic material that is electrically insulating can be used as the material of the gate insulating layer 103.

As an organic material, for example, acrylic resin, phenolic resin, fluorine resin, epoxy resin, imide resin, or novolac resin can be used.

Further, as an inorganic material, for example, a metal oxide such as silicon oxide, aluminium oxide, tantalum oxide, zirconium oxide, cerium oxide, zinc oxide, or cobalt oxide, a metal nitride such as silicon nitride, aluminium nitride, zirconium nitride, cerium nitride, zinc nitride, cobalt nitride, titanium nitride, or tantalum nitride, or a metal composite oxide such as barium strontium titanate or zirconium titanate. One, two, or more of the above can be combined.

Further, surface treatment agents (ODTS, OTS, HMDS, βPTS, etc.) that treat a surface may be included.

(iv) Channel Layers 104, 105

For each of the channel layers 104, 105, a layer of amorphous indium gallium zinc oxide (IGZO) of thickness approximately 50 nm is used. Material of the channel layers 104, 105 is not limited to this example, and an oxide semiconductor including at least one material selected from indium (In), gallium (Ga), and zinc (Zn) can be used.

Further, thickness of the channel layers 104, 105 can be in a range from 20 nm to 200 nm, and thicknesses of the channel layers 104 and the channel layers 105 can be set to be different from each other.

(v) Channel Protection Layer 106

For the channel protection layer 106, a layer of silicon oxide ($SiO_2$) having a thickness of approximately 130 nm is used. Material of the channel protection layer 106 is not limited to this example, and silicon oxynitride (SiON), silicon nitride (SiN), or aluminium oxide (AlOx) can be used, for example. Further, the channel protection layer 106 can be configured to have a plurality of layers, each layer using one of the materials above.

Further, thickness of the channel protection layer 106 can be in a range from 50 nm to 500 nm.

(vi) Source Electrodes 107, 110, Drain Electrodes 108, 109, and Lead Wiring Layer Patterns 207

For the source electrodes 107, 110, the drain electrodes 108, 109, and the lead wiring layer patterns 207, a layered body of copper manganese (CuMn), copper (Cu), and molybdenum is used (CuMn: approx. 65 nm, Cu: approx. 300 nm, Mo: approx. 20 nm). However, thicknesses of each layer are not limited to this example, and thickness of copper manganese (CuMn) can be in a range from 5 nm to 200 nm, thickness of copper (Cu) can be in a range from 50 nm to 800 nm, and thickness of molybdenum (Mo) can be in a range from 5 nm to 200 nm. Further, the lead wiring layer patterns 207 can be alloy layers including copper.

Further, the source lower electrodes 111, 115 and the drain lower electrodes 112, 114 can be configured using the same materials. Further, the following may be integrally formed: the source electrode 107 and the source lower electrode 111; the drain electrode 108 and the drain lower electrode 112; the drain electrode 109 and the drain lower electrode 114; and the source electrode 110 and the source lower electrode 115.

(vii) Passivation Layers 116, 216

According to the display panel 10 pertaining to the present embodiment, a lower insulating layer 1161, a barrier layer 1162, an upper insulating layer 1163, and an uppermost insulating layer 1164 have a layered structure layered in order from a lower side in the Z-axis direction.

The lower insulating layer 1161 is a layer of silicon oxide ($SiO_2$) having a thickness of approximately 200 nm. The barrier layer 1162 is a layer of aluminium oxide (AlOx) having a thickness of approximately 30 nm. The upper insulating layer 1163 is a layer of silicon oxide ($SiO_2$) having a thickness of approximately 200 nm. The uppermost insulating layer 1164 is a layer of silicon nitride (SiN) having a thickness of approximately 160 nm. However, layer thicknesses are not limited to these examples, for example the lower insulating layer 1161 can be in a range from 50 nm to 400 nm, the barrier layer 1162 can be in a range from 5 nm to 100 nm, the upper insulating layer 1163 can be in a range from 50 nm to 400 nm, and the uppermost insulating layer 1164 can be in a range from 50 nm to 300 nm. Further, thickness of the passivation layer 116 can be in a range from 200 nm to 1000 nm.

As shown in FIG. 4, the barrier layer 1162 is disposed between the lower insulating layer 1161 and the upper insulating layer 1163, and the lower insulating layer 1161 is in contact with the source electrodes 107, 110 and the drain electrodes 108, 109.

Here, the lower insulating layer 1161 made from silicon oxide preferably has excellent adhesion to the source electrodes 107, 110 and the drain electrodes 108, 109, which are made from the materials described above, and preferably contains a small amount of hydrogen.

The barrier layer 1162 has functions of suppressing entry of moisture and hydrogen and suppressing deterioration of the channel layers 104, 105, which are made from a semiconductor oxide (e.g. IGZO). In order to provide the function of suppressing entry of moisture and hydrogen, layer density of the barrier layer 1162 is preferably equal to or greater than 2.80 $g/cm^3$. That is, when the layer density of the barrier layer 1162 is less than 2.80 $g/cm^3$, the function of suppressing entry of moisture and hydrogen rapidly decreases and deterioration of the channel layers 104, 105 becomes significant (a decrease in sheet resistance).

Further, layer density of the barrier layer is preferably equal to or less than 3.25 $g/cm^3$. Here, when forming contact holes for forming the upper connecting electrode layer 117, wet etching is used on the barrier layer 1162, but when layer density exceeds 3.25 $g/cm^3$, etching rate is very low, and from the viewpoint of production efficiency, layer density equal to or less than 3.25 $g/cm^3$ is preferable.

The lower insulating layer 1151, aside from the materials described above, can use silicon nitride (SiN) or silicon oxynitride (SiON). The upper insulating layer 1163, aside from the materials described above, can use silicon oxide (SiO) or silicon oxynitride (SiON).

(viii) Lower Connecting Electrode Layer 137, Connecting Wiring Layer Patterns 237

For the lower connecting electrode layer 137 and the connecting wiring layer patterns 237, indium tin oxide (ITO) (ITO: approx. 50 nm) is used. However, thickness is not limited to this example, and may be in a range from 5 nm to 200 nm, for example. Material used in the lower connecting electrode layers 137, 237 is not limited to this example, and may be selected from appropriate electrically conductive materials.

(ix) Upper Connecting Electrode Layer 117, Sealing Patterns 217

For the upper connecting electrode layer 117 and the sealing layer patterns 217, layered bodies of molybdenum (Mo), copper (Cu), and copper-manganese (CuMn) (Mo: approx. 20 nm, Cu: approx. 375 nm, and CuMn: approx. 65 nm) are used. However, thicknesses of each layer are not limited to these examples, and, for example, thickness of molybdenum (Mo) can be in a range from 5 nm to 200 nm, thickness of copper (Cu) can be in a range from 50 nm to 800 nm, and thickness of copper manganese (CuMn) can be in a range from 5 nm to 200 nm. Further, the sealing layer patterns 217 can be alloy layers including copper. Material used in the upper connecting electrode layer 117 and the sealing layer patterns 217 is not limited to these examples, and may be selected from appropriate electrically conductive materials.

(x) Upper Passivation Layer 136

According to the display panel 10 pertaining to the present embodiment, the upper passivation layer 136 is a layer of silicon nitride (SiN) having a thickness of approximately 100 nm. However, thickness is not limited to this example, and may be in a range from 50 nm to 300 nm, for example.

(xi) Interlayer Insulating Layer 118

The interlayer insulating layer 118 are formed by using an organic compound such as polyimide, polyamide, or an acrylic-based resin, and have thicknesses of approx. 4000 nm. However, thickness is not limited to this example, and may be in a range from 2000 nm to 8000 nm, for example.

(xii) Anode 119, Upper Sealing Layer Patterns 219

The anode 119 and the upper sealing layer patterns 219 are made from metal material. In the case of the display panel 10 pertaining to the present embodiment, which is a top-emission type, surfaces of the anode 119 and the upper sealing layer patterns 219 are preferably highly reflective. According to the display panel 10 pertaining to the present embodiment, the anode 119 and each of the upper sealing layer patterns 219 are layered bodies of tungsten (W) and aluminium (Al) or aluminium alloy (W: approx. 40 nm, Al: approx. 200 nm). However, thicknesses are not limited to these examples, and thickness of a layer of tungsten (W) may be in a range from 5 nm to 200 nm and thickness of Al may be in a range from 50 nm to 800 nm, for example.

The anode 119 and the upper sealing layer patterns 219 are not restricted to the configurations described above, and may each be a single metal layer, alloy layer, or light-transmissive electrically-conductive layer. Further, they may each be a plurality of layers, each layer being a metal layer, an alloy layer, or a light-transmissive electrically-conductive layer. As a metal layer, a metal material including silver (Ag) or aluminium (Al) may be used, for example. As an alloy layer, silver palladium copper alloy (APC), silver palladium gold alloy (ARA), molybdenum chromium alloy (MoCr), or nickel chromium alloy (NiCr) may be used, for example. As a light-transmissive electrically-conductive material, indium tin oxide (ITO) or indium zinc oxide (IZO) may be used, for example.

(xi) Hole Injection Layer 120

The hole injection layer 120 is a layer made from an oxide of materials such as silver (Ag), molybdenum (Mo), chromium (Cr), vanadium (V), tungsten (W), nickel (Ni), or iridium (Ir), or an electrically conductive polymer material such as poly(3,4-ethylenedioxythiophene) polystyrene sulfonate (PEDOT:PSS). For the display panel 10 pertaining to the present embodiment shown in FIG. 4, the hole injection layer 120 is assumed to configured from a metal oxide, and compared to a case in which an electrically conductive polymer material such as PEDOT:PSS is used, this case has a function of injecting holes to the organic light-emitting layer 123 by stabilizing holes or assisting in generation of holes, and has a high work function.

In a case of the hole injection layer 120 being configured from a transition metal oxide, a plurality of energy levels can be obtained from a plurality of valences, and as a result hole injection becomes easier and drive voltage can be decreased. In particular, use of tungsten oxide ($WO_x$) is preferable from the perspective of having a function of stably injecting holes and assisting in generation of holes. In the display panel 10 pertaining to the present embodiment, tungsten oxide ($WO_x$) ($WO_x$: approx. 10 nm) is used. However, thickness is not limited to this example, and thickness of a layer of tungsten oxide ($WO_x$) may be in a range from 5 nm to 30 nm, for example.

(xiii) Bank 121

The banks 121 are formed from an organic material such as a resin and have insulating properties. As an example of an organic material that may be used in forming the banks 121, acrylic-based resin, polyimide-based resin, or novalac-type phenolic resin may be used. The banks 121 preferably have organic solvent resistance. Further, during the production process, the banks 121 are subjected to an etching process, a baking process, etc., and therefore the banks 121 are preferably formed from a material having a high resistance to deformation, deterioration, etc., during such processes. Further, in order to impart water repellency to surfaces of the banks 121, the surfaces may be fluorine-treated.

This is because, in a case of the banks 121 being formed using a lyophilic material, a difference in lyophilicity/liquid repellency of surfaces of the banks 121 and surfaces of the light-emitting layer 123 would become small, and it would become difficult to selectively retain ink including organic material for forming the light-emitting layer 123 in an opening defined by the banks 121.

Further, structure of the banks 121 is not limited to the single-layer structure illustrated in FIG. 4, and may be a multi-layered structure having two or more layers. In such a case, each layer may be a combination of the materials above, or each layer may be an inorganic material or an organic material.

(xiv) Hole Transport Layer 122

The hole transport layer 122 is formed by using a polymer compound having no hydrophilic group. For example, a high molecular compound that has no hydrophilic group may be used, such as polyfluorene, a derivative thereof, polyarylamine, or a derivative thereof.

(xv) Light-Emitting Layer 123

The light-emitting layer 123, as stated above, has a function of emitting light generated by an excited state due to recombination of holes and electrons injected thereto. As a material used in forming the light-emitting layer 123 it is necessary to use a light-emitting organic material that can form a thin film by use of a wet printing method.

For example, as disclosed in JP H5-163488, a phosphorescent material is preferably used, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth complex, or similar.

(xvi) Electron Transport Layer 124

The electron transport layer 124 has a function of transporting electrons injected from the cathode 125 to the light-emitting layer 123, and is formed by using, for example, an oxadiazole derivative (OXD), a triazole derivative (TAZ), or a phenanthroline derivative (BCP, Bphen).

(xvii) Cathode 125

The cathode 125 is formed by using indium tin oxide (ITO) or indium zinc oxide (IZO), for example. In the case of the display panel 10 pertaining to present embodiment, which is a top-emission type, the cathode 125 is necessarily formed from a light-transmissive material. As a light-transmissive material, light transmission of 80% or greater is preferable.

(xviii) Sealing Layer 126

The sealing layer 126 has a function of suppressing exposure of organic layers such as the light-emitting layer 123 to moisture and air, and may be formed from a material such as silicon nitride (SiN) or silicon oxynitride (SiON). Further, on a layer formed from a material such as silicon nitride (SiN) or silicon oxynitride (SiON), a sealing resin layer composed of resin material such as acrylic resin or silicone resin may be provided.

In the case of the display panel 10 pertaining to present embodiment, which is a top-emission type, the sealing layer 126 is necessarily formed from a light-transmissive material.

4. Display Panel 10 Manufacturing Method
4.1 Pixel Region 10A

The following describes a method of manufacturing the pixel region 10A of the display panel 10.

(1) Forming Gate Electrodes 101, 102

The gate electrodes 101, 102 are formed separated from each other on an upper surface of the substrate 100 in the Z axis direction. In forming the gate electrodes 101, 102, a metal thin film made from Cu and a metal thin film made from Mo are formed in this order on the surface of the substrate 100 by using metal sputtering, then a resist pattern is formed thereon by using photolithography. Subsequently, after wet etching, the resist pattern is removed. Thus, the gate electrodes 101, 102 are formed.

(2) Forming Gate Insulating Layer 103 and Channel Layers 104, 105

The gate insulating layer 103 is formed covering the gate electrodes 101, 102 and surface of the substrate 100, and the channel layers 104, 105 are formed separated from each other on a surface of the gate insulating layer 103. The gate insulating layer 103 is formed by using plasma chemical vapor deposition (CVD) or sputtering. The channel layers 104, 105 are formed as oxide semiconductor layers by using sputtering, and are patterned by using photolithography and wet etching.

(3) Forming Channel Protection Layer 106

The channel protection layer 106 is formed covering the channel layers 104, 105 and a surface of the gate insulating layer 103. The channel protection layer 106 is formed by using plasma CVD or sputtering to form a layer made from SiO, then finished by annealing at a temperature equal or greater than a film-forming temperature in a dry air or oxygen atmosphere.

(4) Forming Source Electrodes 107, 110 and Drain Electrodes 108, 109

The source electrodes 107, 110 and the drain electrodes 108, 109 are formed on a surface of the channel protection layer 106. Further, with respect to the source electrodes 107, 110 and the drain electrodes 108, 109, the source lower electrodes 111, 115, the drain lower electrodes 112, 114, and the contact plug 113 are formed.

First, contact holes are opened in portions of the channel protection layer 106. The contact holes are formed by patterning using photolithography, followed by etching using a dry etching method. Subsequently, using sputtering, a metal thin film made from Mo, a metal thin film made from Cu, and a metal thin film made from CuMn are formed in this order. Subsequently, the source electrodes 107, 110 and the drain electrodes 108, 109 are patterned by using photolithography and wet etching. As an etchant in the etching, persulfate oxidizing etchant, hydrogen peroxide etchant, copper chloride etchant, or iron chloride etchant can be used. For example, when hydrogen peroxide etchant is used, etching is performed by oxidation and dissolution by aqueous hydrogen peroxide and dissolution by organic acid.

(5) Forming Passivation Layer 116

The passivation layer 116 is formed by layering the lower insulating layer 1161, the barrier layer 1162, the upper insulating layer 1163, and the uppermost insulating layer 1164 in this order to cover the source electrodes 107, 110, the drain electrodes 108, 109, and the channel protection layer 106. The lower insulating layer 1161 is formed by using plasma CVD or sputtering to form a layer, then annealing in a dry air or oxygen atmosphere. The barrier layer 1162 is formed by using CVD, atomic layer deposition (ALD), or sputtering to form a layer. The upper insulating layer 1163 and the uppermost insulating layer 1164 are each formed by using plasma CVD or sputtering.

(6) Opening Contact Hole 116a in Passivation Layer 116

The contact hole 116a is opened in the passivation layer 116 at a location over the source electrode 110. The contact hole 116a is formed so that a bottom thereof exposes a surface of the source electrode 110. The contact hole 116a is formed as follows.

A hole is opened in the upper insulating layer 1163 by using dry etching. At a bottom of this hole, a surface of the barrier layer 1162 is exposed.

Subsequently, a hole is opened in the barrier layer 1162 by using wet etching. At a bottom of this hole, a surface of the lower insulating layer 1161 is exposed.

Subsequently, a hole is opened in the lower insulating layer 1161 by using dry etching, finishing the contact hole 116a. As stated above, at the bottom of the contact hole 116a, the surface of the source electrode layer 110 is exposed.

The contact hole 116a is opened in the passivation layer 116 as described above.

(7) Forming Lower Connecting Electrode Layer 137

The lower connecting electrode layer 137 is formed covering an upper portion of the passivation layer 116 and around a side wall of the contact hole 116a opened in the passivation layer 116. As the lower connecting electrode layer 137, indium tin oxide (ITO) can be used, for example, formed by vacuum deposition.

(8) Forming Upper Connecting Electrode Layer 117

The upper connecting electrode layer 117 is formed layered on the lower connecting electrode layer 137, following the side wall of the contact hole 116a opened in the passivation layer 116. An upper portion of the upper connecting electrode layer 117 is disposed above the upper insulating layer 1163.

Sputtering is used to form the upper connecting electrode layer 117. After forming a metal thin film from Mo, a metal thin film from Cu, and a metal thin film from CuMn, layered in this order, patterning is performed by using photolithography and wet etching.

(9) Forming Upper Passivation Layer 136

The upper passivation layer 136 is formed covering the upper connecting electrode layer 117 and the passivation layer 116. The upper passivation layer 136 is formed by using plasma CVD or sputtering.

(10) Forming Interlayer Insulating Layer 118

The interlayer insulating layer 118 is formed covering the passivation layer 116. The interlayer insulating layer 218 is formed by applying the organic material described above, and planarizing a surface thereof.

(11) Forming Anode 119

A contact hole is opened in the interlayer insulating layer 118 over the upper connecting electrode layer 117 and the anode 119 is formed.

The anode 119 is formed by using sputtering or vacuum deposition. After forming a thin film from tungsten (W) and a thin film from aluminium (Al) or aluminium alloy layered in this order, patterning is performed by using photolithography and etching. As an etchant in the etching, persulfate oxidizing etchant, hydrogen peroxide etchant, copper chloride etchant, or iron chloride etchant can be used. The anode 119 is electrically connected to the upper connecting electrode layer 117.

(12) Forming Hole Injection Layer 120 and Banks 121

The hole injection layer 120 is formed on the anode 119, and the banks 121 are formed covering edges of the anode 119. The banks 121 surround openings that each define a sub-pixel, and at a bottom of an opening, a surface of the hole injection layer 120 is exposed.

The hole injection layer 120 is formed by forming a film from a metal oxide (for example, tungsten oxide (WO$_x$)) by using sputtering, then patterning to each sub-pixel by using photolithography and etching.

The banks 121 are formed by first forming a layer composed of a material of the banks 121 (for example, a photosensitive resin material) on the hole injection layer 120 by using a spin coating method or similar. Subsequently, the resin layer is patterned to form the openings. Forming the openings includes disposing a mask above the resin layer, exposing the resin layer to light, and developing.

(13) Forming Hole Transport Layer 122, Light-Emitting Layer 123, and Electron Transport Layer 124

In each of the openings defined by the banks 121, starting from the hole injection layer 120, the hole transport layer 122, the light-emitting layer 123, and the electron transport layer 124 are layered thereon in this order.

Forming the hole transport layer 122 includes applying ink that contains component material into the openings defined by the banks 121, and subsequently baking. In the same way, the light-emitting layer 123 is formed by using printing to apply ink that contains component material on the hole transport layer 122, and subsequently baking.

(14) Forming Cathode 125 and Sealing Layer 126

The cathode 125 and the sealing layer 126 are formed in this order, covering the electron transport layer 124 and upper portions of the banks 121.

The cathode 125 and the sealing layer 126 can be formed by using sputtering.

Subsequently, the substrate 130 on which the color filter layer 128, etc., are formed is attached via the joining layer 127, completing the display panel 10.

4.2 Connection Region 10b

The following describes a method of manufacturing the connection region 10b of the display device 10, with reference to the drawings. FIG. 7A, FIG. 7B, FIG. 7C, FIG. 7D, FIG. 7E, FIG. 7F, FIG. 8A, FIG. 8B, FIG. 8C, FIG. 8D, FIG. 9A, FIG. 9B, and FIG. 9C are schematic cross-sections showing states during processes in manufacture of the display panel 10.

(1) Forming Lead Wiring Layer Pattern 207 from Source Electrode 107

In this process, at the same time as forming the source electrode 107 in the pixel region 10A, the lead wiring layer patterns 207 are formed on the substrate 100 from the source electrode 107.

Figure 7A:
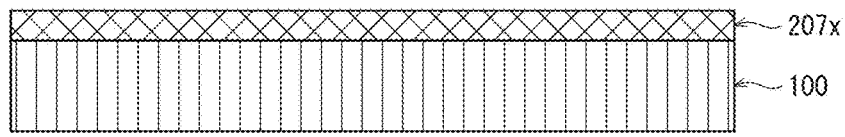
FIG. 7A, FIG. 7B, FIG. 7C, FIG. 7D, FIG. 7E, and FIG. 7F are schematic cross-sections showing states during processes in manufacture of the display panel 10.
Figure 7B:
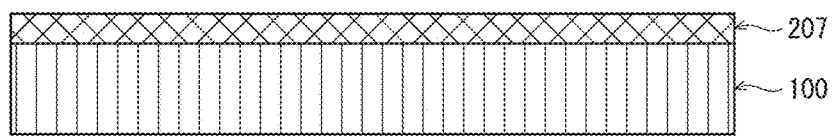

First, as shown in FIG. 7A, using sputtering for example, a metal thin film made from Mo, a metal thin film made from Cu, and a metal thin film made from CuMn are layered in order (207x). Subsequently, as shown in FIG. 7B, using photolithography and wet etching, for example, the lead wiring layer patterns 207 are patterned.

(2) Forming Passivation Layer 216

Figure 7C:
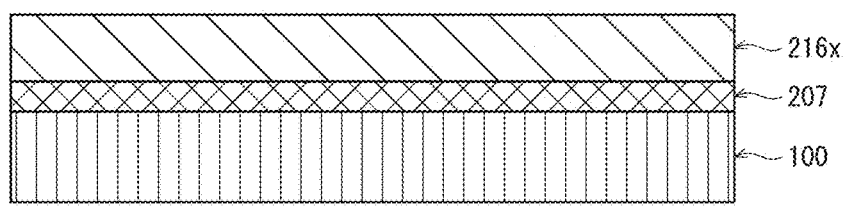

The passivation layer 216 is configured from a lower insulating layer, a barrier layer, an upper insulating layer, and an uppermost insulating layer (not illustrated), and a process of forming the passivation layer 216 is performed at the same time as a process of forming the passivation layer 116 in the pixel region 10A (the lower insulating layer 1161, the barrier layer 1162, the upper insulating layer 1163, and the uppermost insulating layer 1164). As shown in FIG. 7C, the passivation layer 216 is layered in the order of the lower insulating layer, the barrier layer, the upper insulating layer and an uppermost insulating layer (216x), covering the lead wiring layer patterns 207.

(3) Opening Contact Hole 216a in Passivation Layer 216

Figure 7D:
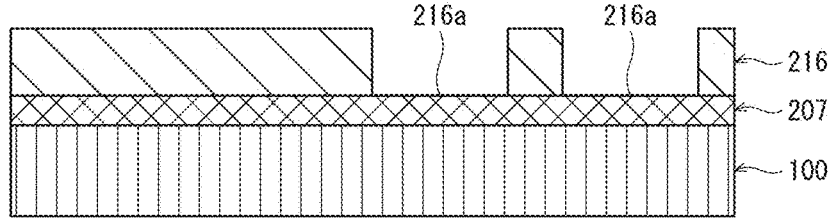

The process of forming the contact hole 216a is performed at the same time as the process of forming the contact hole 116a in the pixel region 10A. The contact hole 216a is opened at locations over the lead wiring layer patterns 207 in the passivation layer 216. As shown in FIG. 7D, the contact hole 216a is formed so a bottom thereof exposes a surface of the lead wiring layer patterns 207. Opening of the contact hole 216a is performed in the same way as for the contact hole 116a, for example dry etching is used to open a hole in the uppermost insulating layer and the upper insulating layer, wet etching is used to open a hole in the barrier layer, and dry etching is used to open a hole in the lower insulating layer. Thus, at the bottom of the contact hole 216a, the surface of the lead wiring layer patterns 207 is exposed.

(4) Forming Connecting Wiring Layer Patterns 237

Figure 7E:
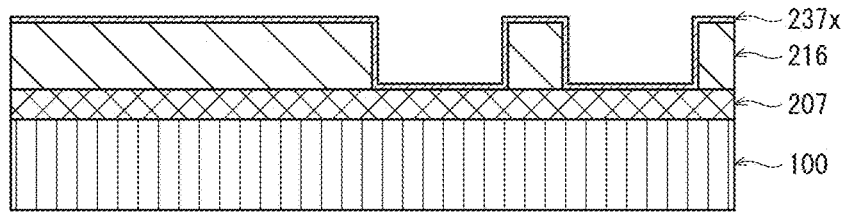
Figure 7F:
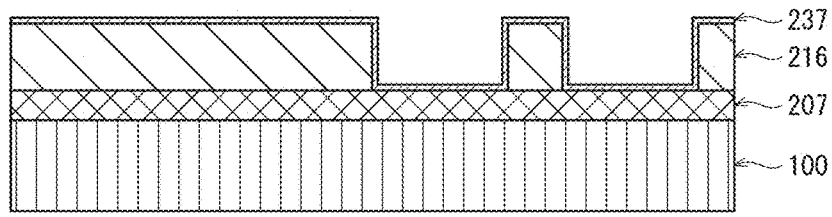

The process of forming the connecting wiring layer patterns 237 is performed at the same time as the process of forming the lower connecting electrode layer 137 in the pixel region 10A. As shown in FIG. 7E, a connecting wiring layer 237x is formed by vacuum deposition, covering the passivation layer 116. As shown in FIG. 7F, using photolithography and wet etching, for example, the connecting wiring layer patterns 237 are patterned.

When the connecting wiring layer patterns 237 are made from ITO, for example, oxalic acid etchant can be used as etchant in etching the connecting wiring layer patterns 237. Etching using oxalic acid etchant is performed by complexing of indium and oxalic acid.

(5) Forming Sealing Layer Patterns 217

The process of forming the sealing layer patterns 217 is performed at the same time as the process of forming the upper connecting electrode layer 117 in the pixel region 10A. The sealing layer patterns 217 are formed around a side wall of the contact hole 216a opened in the passivation layer 216. Upper portions of the sealing layer patterns 217 are partially disposed on the upper insulating layer of the passivation layer 216.

Figure 8A:
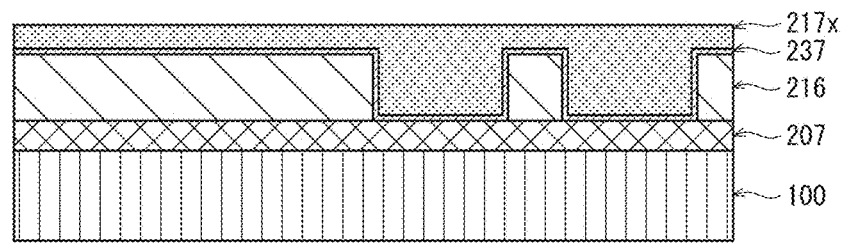
FIG. 8A, FIG. 8B, FIG. 8C, and FIG. 8D are schematic cross-sections showing states during processes in manufacture of the display panel 10.
Figure 8B:
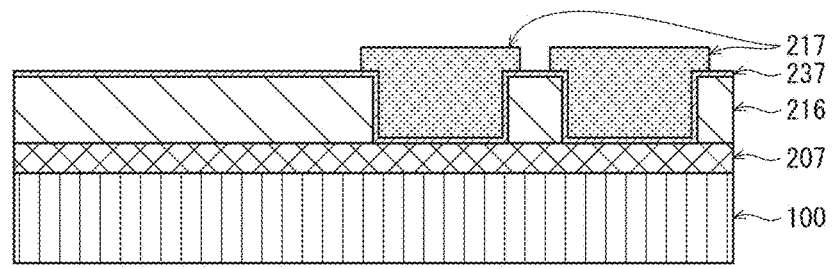

The sealing layer patterns 217 are patterned using photolithography and wet etching, for example, patterning the lead wiring layer patterns 207. As shown in FIG. 8A, using sputtering for example, a metal thin film made from Mo, a metal thin film made from Cu, and a metal thin film made from CuMn are layered in order to form a metal layer 217x. Subsequently, as shown in FIG. 8B, patterning is performed using photolithography and wet etching, for example.

(6) Forming Upper Sealing Layer Patterns 219

The process of forming the upper sealing layer patterns 219 is performed at the same time as the process of forming the anode 119 in the pixel region 10A.

The upper sealing layer patterns 219 are formed covering the sealing layer patterns 217 in the wiring connecting portions 220 of the connecting wiring layer patterns 237.

Figure 8C:
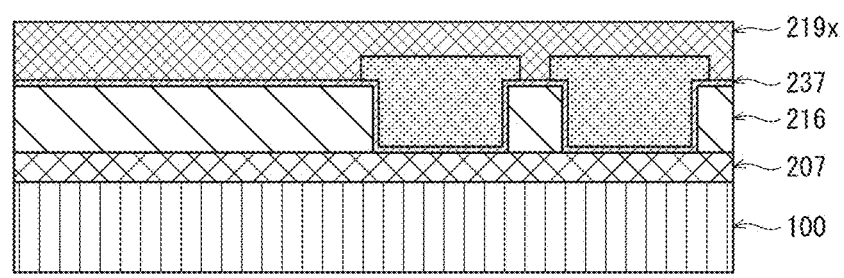
Figure 8D:
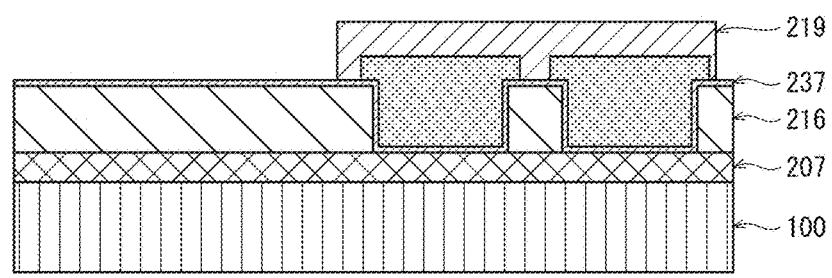

As shown in FIG. 8C, the upper sealing layer patterns 219 are formed by using sputtering or vacuum deposition to form a thin film made from tungsten (W) and a thin film made from aluminium (Al) or aluminium alloy layered in this order to form a metal layer 219x. Subsequently, as shown in FIG. 8D, photolithography and etching is used to perform patterning. The upper sealing layer patterns 219 are electrically connected to the sealing layer patterns 217.

5. Effects

As described above, the display device pertaining to Embodiment 1 comprises: the substrate 100; the light-emitter EL disposed on the substrate 100; the transistors (Tr$_1$, Tr$_2$) that drive the light-emitter EL; the lead wiring layer pattern 207 that extends from the source S$_2$, the drain D$_1$, or the gate G$_2$ of one of the transistors (Tr$_1$, Tr$_2$) to the outer region outside the pixel region 10A in which the light-emitter is present; the passivation layer 216 in which the contact hole 216a is opened, the contact hole 216a, in plan view, being superimposed over the lead wiring layer pattern 207 in the outer region; the connecting wiring layer pattern 237 that is continuous across the passivation layer 216, the inner circumference of the contact hole 216a, and the lead wiring layer pattern 207 in the contact hole 216a; the sealing layer pattern 217, which is electrically conductive, disposed on the connecting wiring layer pattern 237, covering the portion of the connecting wiring layer pattern 237 in the contact hole 216a; and the upper sealing layer pattern 219, which is electrically conductive, disposed above the connecting wiring layer pattern 237, covering and in contact with the portion of the sealing layer pattern 217. Further, the display device can be configured to have the connecting terminal portion 237a for connecting a portion of the connecting wiring layer pattern 237 on the passivation layer 216 to wiring outside the pixel region 10A.

Typically, ITO is not complexed or etched by hydrogen peroxide etchant, and therefore when hydrogen peroxide etchant is used in etching of the anode 119, ITO can be used as a cover metal for the connecting wiring layer patterns 237. However, the connecting wiring layer patterns 237 each have a thickness of, for example, 5 nm to 200 nm, which is insufficient to function as a cover metal. Further, when etchant other than hydrogen peroxide etchant is used, the connecting wiring layer patterns 237 are insufficient to function as a cover metal. In particular, ITO dissolves when oxalic acid etchant is used. Thus, in etching of the anode 119, for example, there is a risk of etchant penetrating downwards through the connecting wiring layer patterns 237 in the contact hole 216a and corroding the lead wiring layer patterns 207 on the substrate 100.

In contrast, according to the configuration pertaining to Embodiment 1, after the connecting wiring layer patterns 237 are formed on the substrate 100, when, for example, the anode 119 of the light-emitter EL are patterned by etching, the contact hole 216a is sealed by the sealing layer patterns 217, which prevents penetration of etchant into the contact hole 216a. Thus, high yield production is possible while suppressing corrosion of the lead wiring layer patterns 207 on the substrate 100 and suppressing deterioration of connections between the lead wiring layer patterns 207 and the connecting wiring layer patterns 237. As a result, an increase in electrical resistance and bad connectivity between the connecting wiring layer patterns 237 and the lead wiring layer patterns is prevented and stability of operation of the display device 1 is increased.

Further, according to the display panel pertaining to the present embodiment, the upper sealing layer patterns 219 cover the sealing layer patterns 217, and therefore, after the sealing layer patterns 217 are formed, when etching, developing, baking, etc., is performed in forming the light-emitters EL, for example, the sealing layer patterns 217 are sealed by the upper sealing layer patterns 219, preventing the sealing layer patterns 217 from being damaged by etchant or heat. Thus, deterioration of the sealing layer patterns 217 is suppressed and high yield production is possible.

Embodiment 2

Figure 9:
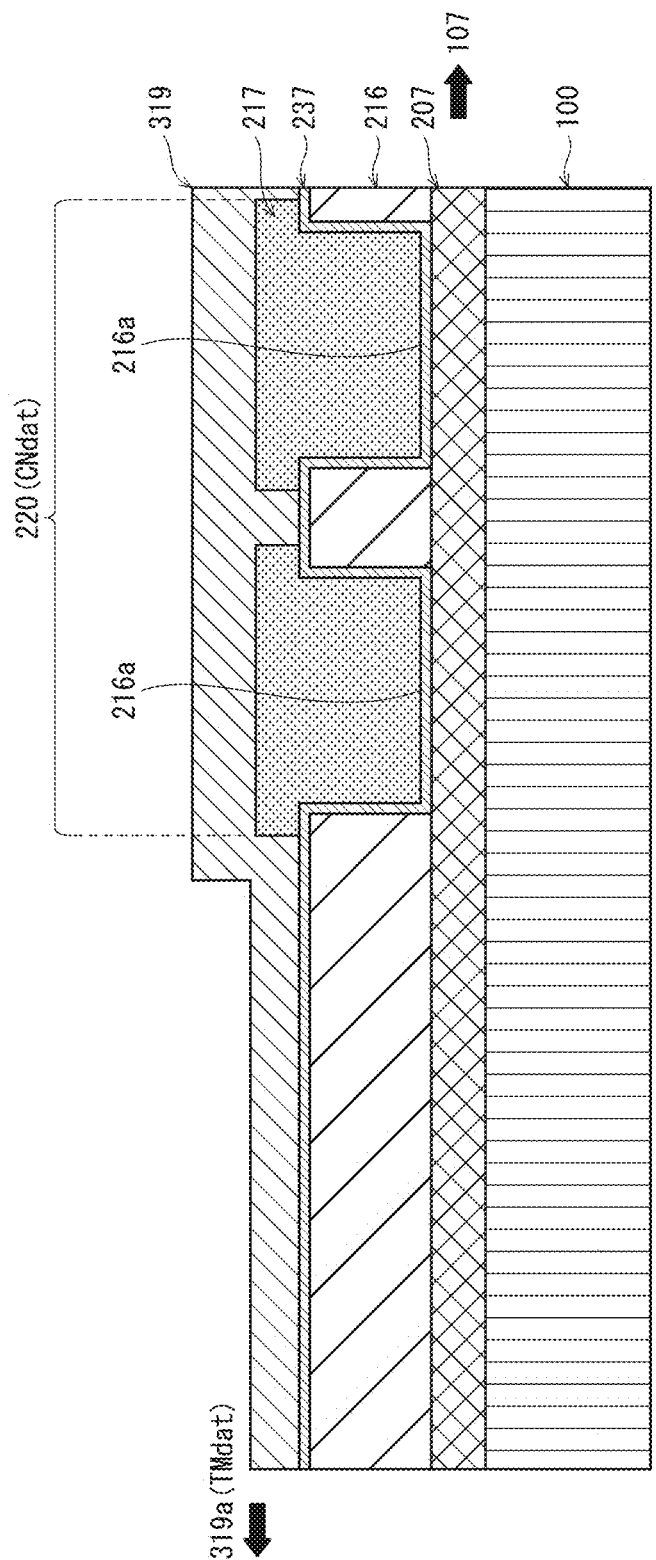
FIG. 9 is a cross-section enlargement taken along a wiring direction of wiring connecting portion of the display panel 10 pertaining to Embodiment 2.

The following describes configuration of a display panel pertaining to Embodiment 2 of the present invention, with reference to FIG. 9. In FIG. 9, only a portion of the display panel is shown. Configurations of portions omitted from FIG. 9 are the same as in the display panel 10 pertaining to Embodiment 1. Further, in FIG. 9, portions that are the same as in the display panel 10 pertaining to Embodiment 1 are assigned the same reference signs.

As shown in FIG. 9, according to the display panel pertaining to the present embodiment, an upper sealing layer pattern 319 extends to a connecting terminal portion 237a along the connecting wiring layer pattern over the passivation layer 216. The upper sealing layer pattern 319 following the connecting wiring layer pattern 237 and extending to the connecting terminal portion 237a reduces sheet resistance. The connecting wiring layer pattern 237 is configured to be thin, having a thickness in a range of 5 nm to 200 nm, and therefore sheet resistance can be reduced by the increase in total thickness of a conductive layer.

Figure 10B:
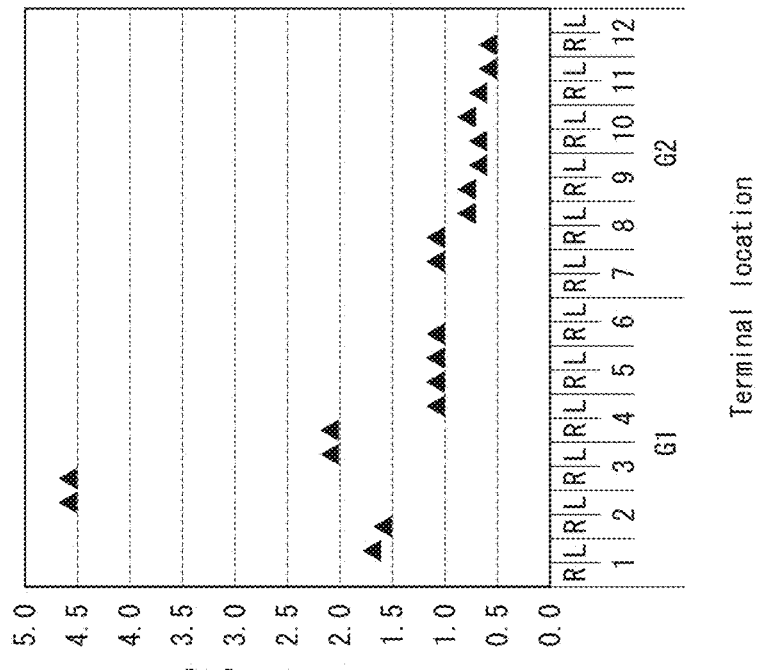
FIG. 10B shows measurement results of wiring resistance of a display panel pertaining to a comparative example.
Figure 10A:
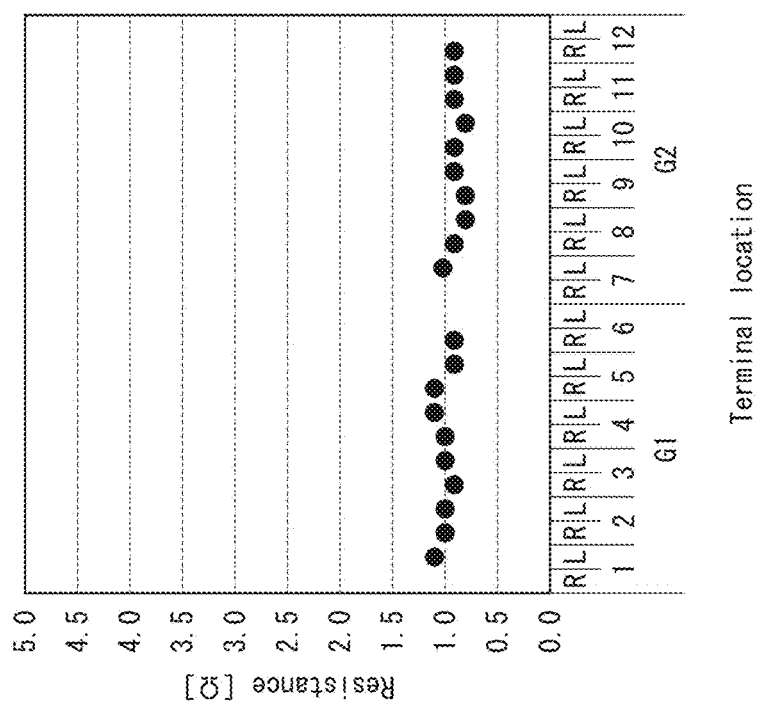
FIG. 10A shows measurement results of wiring resistance of a display panel pertaining to Embodiment 2.

Further, variation in resistance is lower when the upper sealing layer pattern 319 extends with the connecting wiring layer pattern 237 to the connecting terminal portion 237a, in comparison with when only the upper sealing layer pattern extends to the connecting terminal portion 237a over the passivation layer 216. FIG. 10A shows measurement results of wiring resistance of a display panel pertaining to Embodiment 2, and FIG. 10B shows measurement results of wiring resistance of a display panel pertaining to a comparative example in which only the upper sealing layer pattern 319 extends to the connecting terminal portion 237a on the upper surface of the passivation layer 216. As shown in FIG. 10A and FIG. 10B, Embodiment 2 shows a reduction of approximately 10% in a fluctuation range of resistance, in comparison to the comparative example. R and L indicate measurement position on the substrate.

Figure 11:
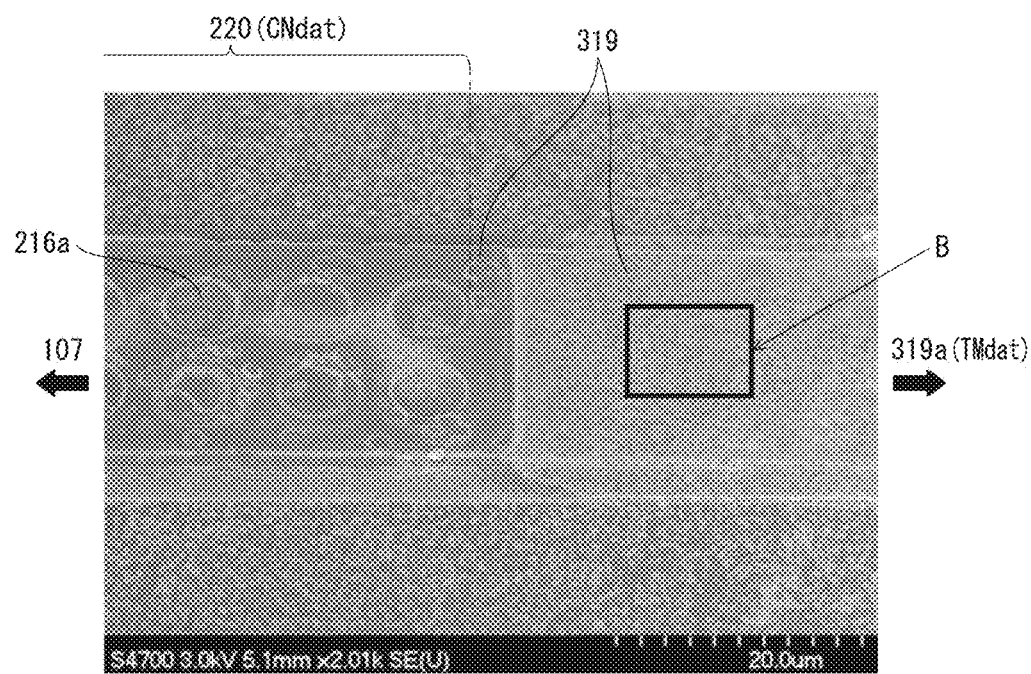
FIG. 11 is a photograph enlargement of a view from above a wiring connecting portion on the upper surface of upper sealing layer patterns 319 of a display panel pertaining to a comparative example.
Figure 12:
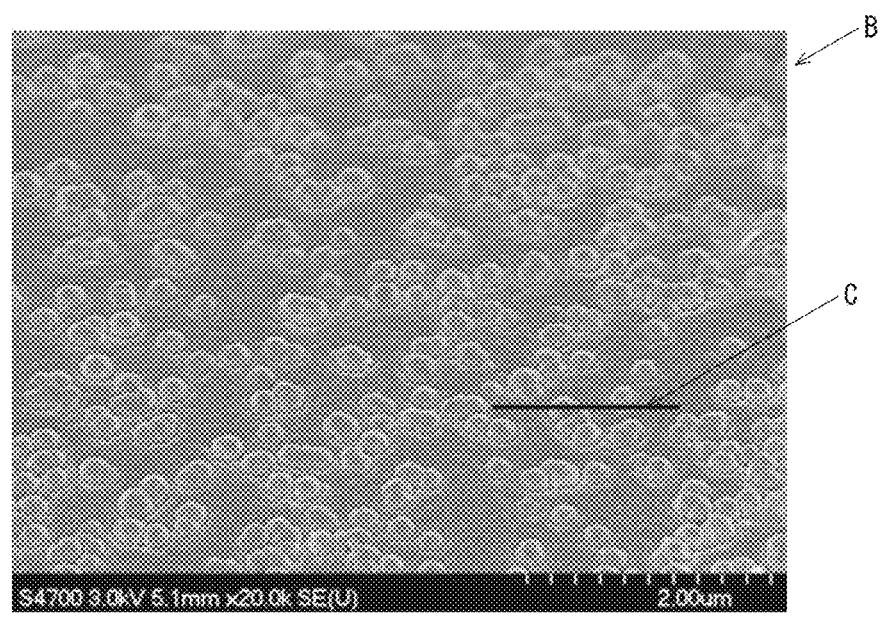
FIG. 12 is a photograph enlargement of a portion B in FIG. 12.
Figure 13:
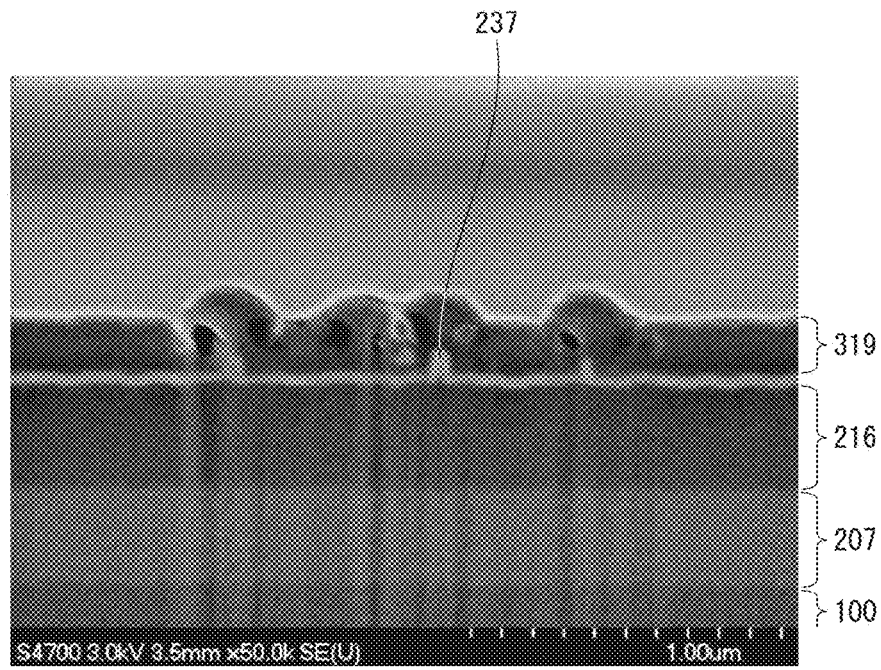
FIG. 13 is a photograph of a cross-section taken along a straight line of portion C in FIG. 12.
Figure 14:
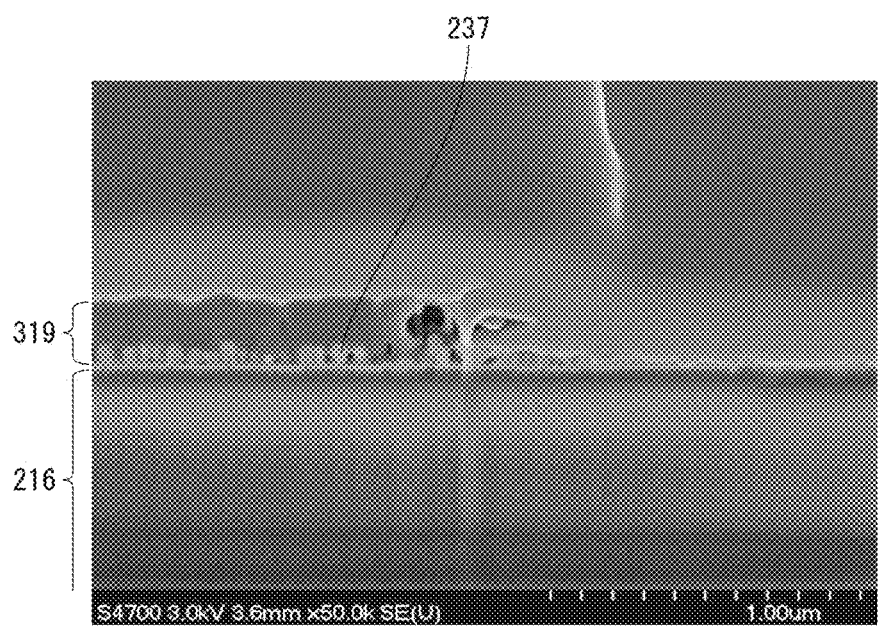
FIG. 14 is a photograph enlargement of a portion in FIG. 13.
Figure 15:
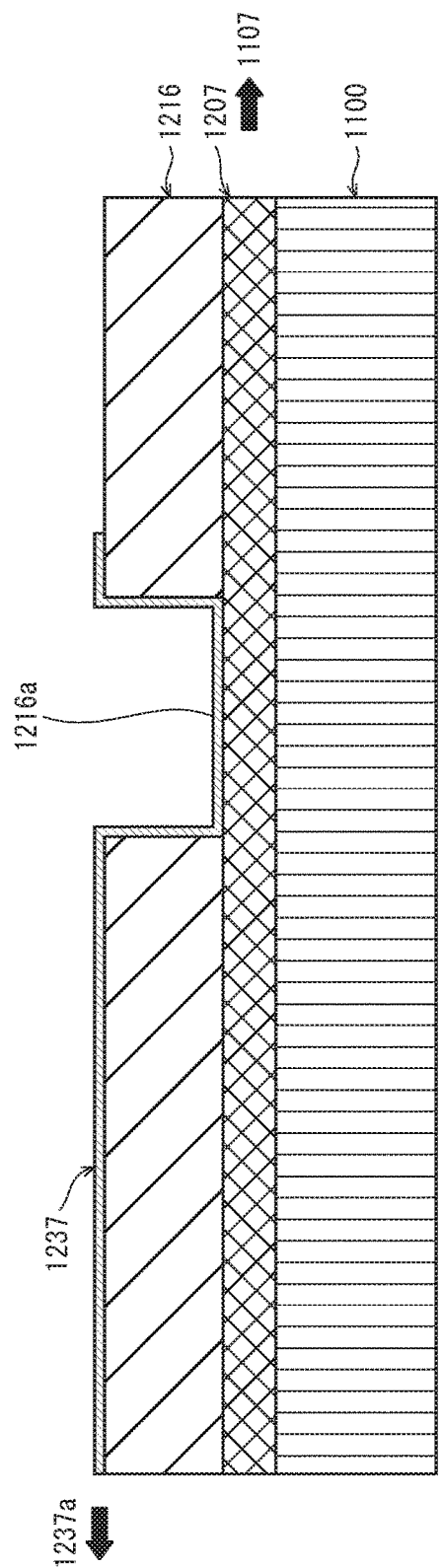
FIG. 15 is a cross-section enlargement taken along a wiring direction of wiring connecting portion of a conventional display panel.

Subsequently, the upper surface of the upper sealing layer pattern 319 of the display panel pertaining to the comparative example that indicated a high tendency to resistance variation was observed. FIG. 11 is a photograph enlargement of a view from above a wiring connecting portion on the upper surface of the upper sealing layer pattern 319 of the display panel pertaining to the comparative example. FIG. 12 is a photograph enlargement of a portion B in FIG. 11. FIG. 13 is a photograph of a cross-section taken along the straight line of the portion C in FIG. 12. FIG. 14 is a photograph enlargement of a portion of FIG. 13. As shown in FIG. 12, granular protrusions were observed on the upper surface of the upper sealing layer pattern 319. As shown in FIG. 13 and FIG. 14, a lower portion of a protrusion of the upper surface of the upper sealing layer pattern 319 is particulate matter at a boundary between the passivation layer 216 and the upper sealing layer pattern 319, and this particulate matter is the cause of the protrusion. This particulate matter is thought to be residue from etching of the connecting wiring layer pattern 237 on the passivation layer 216. ITO is difficult to completely remove by etching, and the residue of particles left at the boundary between the passivation layer 216 and the upper sealing layer pattern 319 is thought to be a factor in resistance variation.

As described above, the upper sealing layer pattern 319 following the connecting wiring layer pattern 237 and extending to the connecting terminal portion 237a reduces sheet resistance and shows a reduction in variation in resistance in comparison to a case in which only the upper sealing layer pattern 319 extends to the connecting terminal portion 237a.

Other Matters

According to embodiments 1 and 2, examples are described in which the lead wiring layer patterns 207 extend from the source electrodes 107. However, the lead wiring layer patterns pertaining to the present embodiments are not limited to lead wiring layer patterns extending from the source electrodes 107 and, for example, lead wiring layer patterns may of course extend from the gate electrodes 101, the drain electrodes 109, or the cathodes 125, and this may also be applied to all electrode patterns extending from drive elements driving light-emitters included in pixels.

Further, according to embodiments 1 and 2, a top-emission type of EL display panel is given as one example, but the present invention is not limited to this. For example, a bottom-emission type of display panel may be used, and a liquid crystal display panel, a field emission display panel, and electronic paper may be used.

Further, according to embodiments 1 and 2, a configuration is used in which two transistors $Tr_1$, $Tr_2$ are supplied for each of the pixels 10a, but the present invention is not limited to this. For example, a configuration may be used in which one transistor is supplied for each sub-pixel, or three or more transistors are supplied for each sub-pixel.

Further, material for each element may be changed as appropriate. For example, the barrier layer in the passivation layer is not limited to AlOx, and may be a nitride or oxynitride containing Al.

Further, gate electrodes, source electrodes, and electrodes may be, for example, layered bodies including a layer composed from Mo and a layer composed from Al, or layered bodies including a layer composed from Mo and a layer composed from Al—Nd.

Further, according to embodiments 1 and 2, an anode is disposed in a lower portion of an EL element and the source electrodes 110 of a TFT device are connected to the anode. However, a configuration may be applied in which a cathode is disposed in the lower portion of the EL element and an anode disposed at the upper portion. In this case, the drains of the TFT device are connected to the cathode disposed in the lower portion.

Further, known materials may be appropriately applied as materials of each element.

Supplement

The embodiments described above each represent one preferred example of the present invention. Values, shapes, materials, components, component positions and connections, processes, process sequences, etc., exemplified by the embodiments are all examples, and are not intended to limit the present invention. Further, elements of the embodiments that are not recited in independent claims that represent topmost concepts of the present invention are described as optional elements constituting a preferred embodiment.

Further, the sequences in which processes are described as being executed are illustrative examples for describing the present invention, and sequences other than those described may be used. Further, a portion of the processes described may be executed simultaneously (in parallel) with another process or other processes.

Further, in order to aid understanding of the invention, the scale of elements in the drawings referenced by the embodiments may differ from actual implementation. Further, the present invention is not limited to the description of the embodiments and may be modified appropriately without departing from the scope of the present invention.

Further, at least a portion of the functionality of the embodiments and the modifications may be combined.

Further, various modifications to the embodiments that may occur to a person having ordinary skill in the art are also included in the scope of the present invention.

INDUSTRIAL APPLICABILITY

The present invention is applicable to implementation of thin-film transistor devices that have good electrical properties and improve production yield due to high workability, and display devices using such thin-film transistor devices.

REFERENCE SIGNS LIST 1 display device
10 display panel
10a pixel
10A pixel region
100 substrate
101 gate electrode
102 gate insulating layer
104, 105 channel layer
106 channel protection layer
107, 110 source electrode
108, 109 drain electrode
111 source lower electrode
112 drain lower electrode
113 contact plug
116, 216 passivation layer
117 upper connecting electrode layer
118 interlayer insulating layer
119 anode
120 hole injection layer
121 bank
122 hole transport layer
123 light-emitting layer
124 electron transport layer
125 cathode
126 sealing layer
127 joining layer
128 color filter layer
129 light-shielding layer
136 upper passivation layer
137 lower connecting electrode layer
207 lead wiring layer patterns
217 sealing layer patterns
219 upper sealing layer patterns
237 connecting wiring layer patterns
EL EL element portion
$Tr_1$ drive transistor
$Tr_2$ switching transistor
C capacitor

The invention claimed is:
1. A display device comprising:
a substrate;
a light-emitter disposed on the substrate;
a transistor that drives the light-emitter;
a lead wiring layer pattern, made from metal, that extends from a source, drain, or gate of the transistor to an outer region outside a region in which the light-emitter is present;
a passivation layer in which a contact hole is opened, the passivation layer being disposed covering the lead wiring layer pattern, the contact hole, in plan view, being superimposed over the lead wiring layer pattern in the outer region;

a connecting wiring layer pattern that is continuous across the passivation layer, an inner circumference of the contact hole, and the lead wiring layer pattern in the contact hole;

a lower sealing layer pattern disposed on the connecting wiring layer pattern, covering a portion of the connecting wiring layer pattern in the contact hole; and an upper sealing layer pattern disposed above the connecting wiring layer pattern, covering the lower sealing layer pattern, wherein the upper sealing layer directly contacts the connecting wire pattern.

2. The display device of claim 1, further comprising:
a connecting terminal portion for connecting a portion of the connecting wiring layer pattern on the passivation layer to wiring.

3. The display device of claim 2, wherein
the lower sealing layer pattern and the upper sealing layer pattern are electrically conductive, and
the upper sealing layer pattern, above the passivation layer, extends along the connecting wiring layer pattern to the connecting terminal portion or near the connecting terminal portion.

4. The display device of claim 2, wherein
the connecting wiring layer pattern extends to a periphery or near the periphery of the substrate, and
the connecting terminal portion is disposed where the connecting wiring layer pattern terminates at the periphery or near the periphery of the substrate.

5. The display device of claim 1, wherein
the lower sealing layer pattern fills the contact hole and an upper portion of the lower sealing layer pattern protrudes from the contact hole.

6. The display device of claim 1, wherein
in the passivation layer, in a plan view, a plurality of the contact holes is superimposed over the lead wiring layer pattern, and a plurality of the lower sealing layer patterns is disposed therein, the lower sealing layer patterns being separate from each other.

7. The display device of claim 1, wherein
in the passivation layer, in a plan view, a plurality of the contact holes is superimposed over the lead wiring layer pattern, and the lower sealing layer pattern is continuous across the plurality of contact holes.

8. The display device of claim 1, wherein
the lead wiring layer pattern is a layered metal body of layers including a layer including copper or the lead wiring layer pattern is an alloy layer including copper.

9. The display device of claim 1, wherein
the lower sealing layer pattern is a layered metal body of layers including a layer including copper or the lower sealing layer pattern is an alloy layer including copper.

10. The display device of claim 1, wherein
the upper sealing layer pattern is a layered metal body consisting of a thin film made from tungsten and a thin film made from aluminum or aluminum alloy.

11. A thin-film transistor device comprising:
a substrate;
a transistor that drives a light-emitter disposed on the substrate;
a lead wiring layer pattern, made from metal, that extends from a source, drain, or gate of the transistor to an outer region outside a region in which the light-emitter is present;

a passivation layer in which a contact hole is opened, the passivation layer being disposed covering at least the lead wiring layer pattern, the contact hole, in plan view, being superimposed over the lead wiring layer pattern in the outer region;

a connecting wiring layer pattern that is continuous across the passivation layer, an inner circumference of the contact hole, and the lead wiring layer pattern in the contact hole;

a lower sealing layer pattern disposed on the connecting wiring layer pattern, covering a portion of the connecting wiring layer pattern in the contact hole; and an upper sealing layer pattern disposed above the connecting wiring layer pattern, covering the lower sealing layer pattern, wherein the upper sealing layer directly contacts the connecting wire pattern, and a connecting terminal portion for connecting a portion of the connecting wiring layer pattern on the passivation layer to wiring outside the region.

12. The thin-film transistor device of claim 11, wherein
the lower sealing layer pattern and the upper sealing layer pattern are electrically conductive, and
the upper sealing layer pattern, above the passivation layer, extends along the connecting wiring layer pattern to the connecting terminal portion or near the connecting terminal portion.

13. The thin-film transistor device of claim 12, wherein
the connecting wiring layer pattern extends to a periphery or near the periphery of the substrate, and
the connecting terminal portion is disposed where the connecting wiring layer pattern terminates at the periphery or near the periphery of the substrate.

14. The thin-film transistor device of claim 11, wherein
the lower sealing layer pattern fills the contact hole and an upper portion of the lower sealing layer pattern protrudes from the contact hole.

15. The thin-film transistor device of claim 11, wherein
in the passivation layer, in a plan view, a plurality of the contact holes is superimposed over the lead wiring layer pattern, and a plurality of the lower sealing layer patterns is disposed therein, the lower sealing layer patterns being separate from each other.

16. The thin-film transistor device of claim 11, wherein
in the passivation layer, in a plan view, a plurality of the contact holes is superimposed over the lead wiring layer pattern, and the lower sealing layer pattern is continuous across the plurality of the contact holes.

17. The thin-film transistor device of claim 11, wherein
the lead wiring layer pattern is a layered metal body of layers including a layer including copper or the lead wiring layer pattern is an alloy layer including copper.

18. The thin-film transistor device of claim 11, wherein
the lower sealing layer pattern is a layered metal body of layers including a layer including copper or the lower sealing layer pattern is an alloy layer including copper.

19. The thin-film transistor device of claim 11, wherein
the upper sealing layer pattern is a layered metal body consisting of a thin film made from tungsten and a thin film made from aluminum or aluminum alloy.

* * * * *